US006954885B2

(12) United States Patent
Hurt et al.

(10) Patent No.: US 6,954,885 B2
(45) Date of Patent: Oct. 11, 2005

(54) METHOD AND APPARATUS FOR CODING BITS OF DATA IN PARALLEL

(75) Inventors: James Y. Hurt, San Diego, CA (US); Michael A. Howard, San Diego, CA (US); Robert J. Fuchs, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 177 days.

(21) Appl. No.: 10/020,532

(22) Filed: Dec. 14, 2001

(65) Prior Publication Data

US 2003/0140304 A1 Jul. 24, 2003

(51) Int. Cl.[7] .......................... H03M 13/27; H03M 13/29
(52) U.S. Cl. .......................... 714/701; 714/702; 714/755
(58) Field of Search ............................... 714/701, 702, 714/755, 786

(56) References Cited

U.S. PATENT DOCUMENTS

| | | | | |
|---|---|---|---|---|
| 4,488,142 A | * | 12/1984 | Franaszek ..................... | 341/59 |
| 4,901,307 A | | 2/1990 | Gilhousen et al. | |
| 4,922,507 A | * | 5/1990 | Simon et al. ................ | 375/254 |
| 5,103,459 A | | 4/1992 | Gilhousen et al. | |
| 5,392,037 A | * | 2/1995 | Kato ........................... | 341/67 |
| 5,592,492 A | * | 1/1997 | Ben-Efraim et al. ......... | 714/702 |
| 5,912,898 A | * | 6/1999 | Khoury ....................... | 714/701 |
| 5,931,965 A | * | 8/1999 | Alamouti ..................... | 714/792 |
| 6,023,783 A | * | 2/2000 | Divsalar et al. ............. | 714/792 |
| 6,028,541 A | * | 2/2000 | Levine ........................ | 341/76 |
| 6,138,262 A | * | 10/2000 | Baek ........................... | 714/768 |
| 6,178,530 B1 | * | 1/2001 | Aman et al. ................. | 714/702 |
| 6,304,991 B1 | * | 10/2001 | Rowitch et al. ............. | 714/755 |
| 6,314,534 B1 | * | 11/2001 | Agrawal et al. ............. | 714/702 |
| 6,323,788 B1 | * | 11/2001 | Kim et al. .................... | 341/81 |
| 6,463,556 B1 | * | 10/2002 | Shaffner et al. ............. | 714/701 |
| 6,549,998 B1 | * | 4/2003 | Pekarich et al. ............. | 711/220 |
| 6,590,951 B1 | * | 7/2003 | Kim et al. ................... | 375/377 |
| 6,625,234 B1 | * | 9/2003 | Cui et al. .................... | 375/341 |
| 6,701,482 B2 | * | 3/2004 | Salvi et al. .................. | 714/786 |
| 2002/0035709 A1 | * | 3/2002 | Chen et al. .................. | 714/702 |
| 2002/0159423 A1 | * | 10/2002 | Yao et al. .................... | 370/342 |
| 2003/0101401 A1 | * | 5/2003 | Salvi et al. .................. | 714/755 |
| 2003/0105913 A1 | * | 6/2003 | Lee .............................. | 711/5 |

FOREIGN PATENT DOCUMENTS

EP          1 085 660 A1     3/2001

OTHER PUBLICATIONS

S. Benedetto et al., "A Soft–Input Soft–Output Maximum A Posteriori (MAP) Module to Decode Parallel and Serial Concatenated Codes," TDA Progress Report, vol. 42, No. 217, Nov. 15, 1996, pp. 1–20.

\* cited by examiner

Primary Examiner—Stephen M. Baker
(74) Attorney, Agent, or Firm—Philip Wadsworth; Sandra L. Godsey

(57) ABSTRACT

A method and apparatus for encoding multiple bits in parallel wherein outputs are generated recursively. During each clock cycle, the encoder processes multiple bits and generates outputs consistent with those generated sequentially over multiple clock cycles in a conventional convolutional encoder. In one embodiment, input data is stored in multiple memory storage units, which are then each uniquely addressed to provide data to parallel encoders.

8 Claims, 19 Drawing Sheets

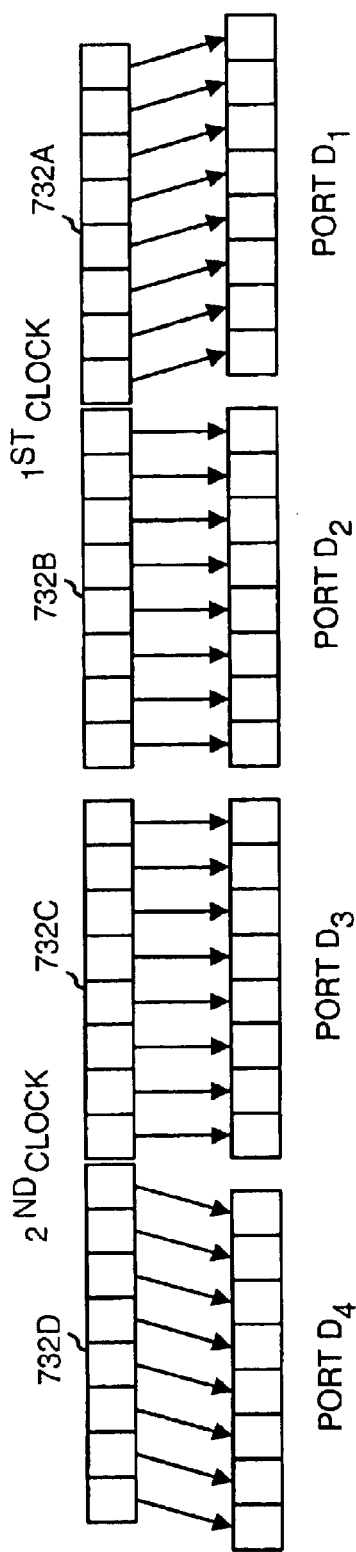
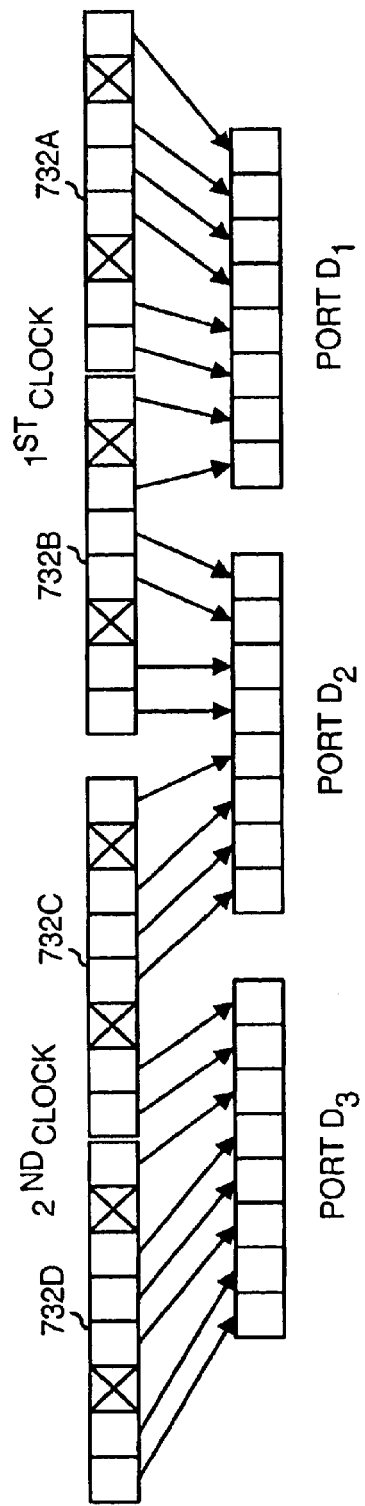
FIG. 7B
FIG. 7C

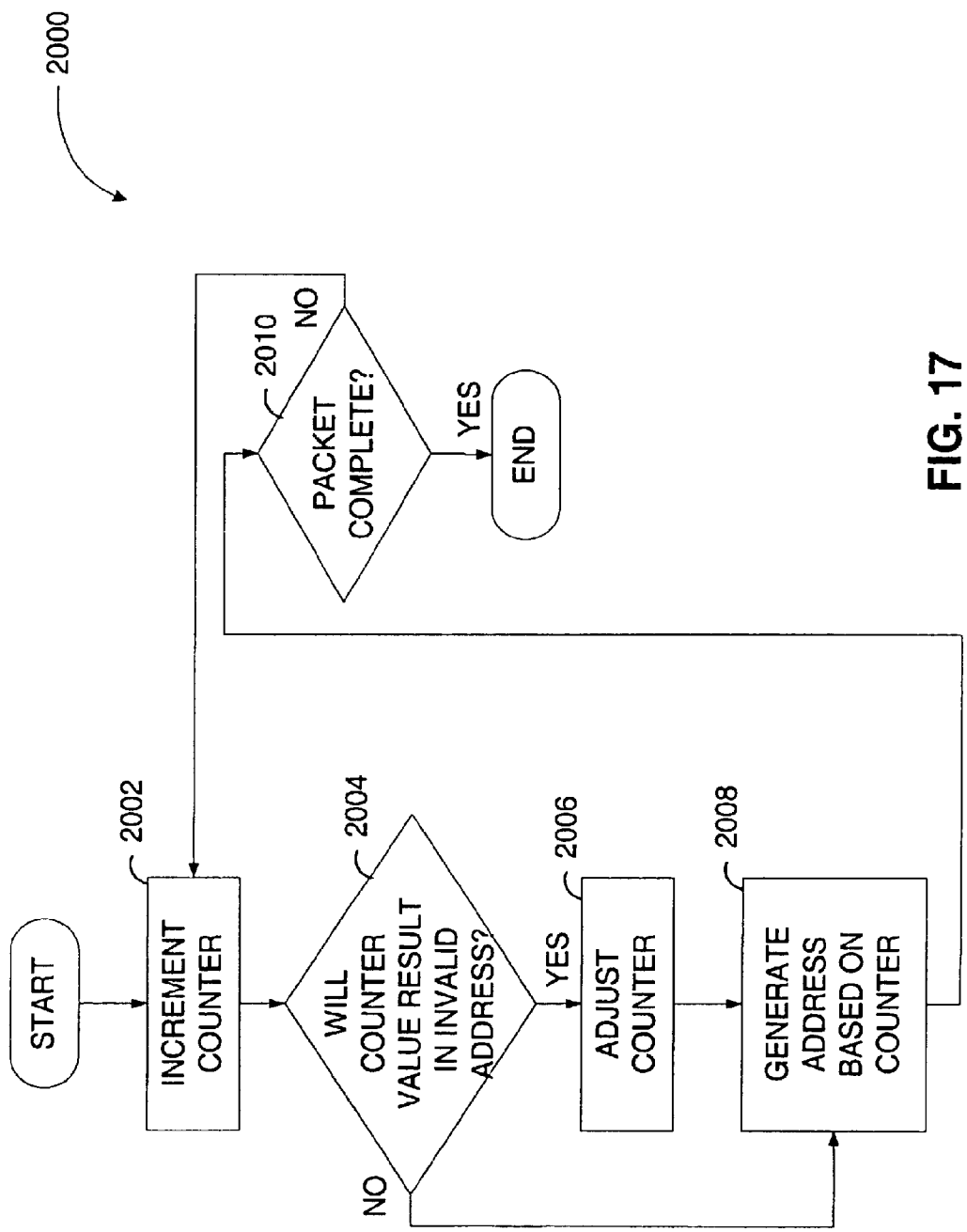

METHOD AND APPARATUS FOR CODING BITS OF DATA IN PARALLEL

REFERENCE TO CO-PENDING APPLICATIONS

The present Application for Patent is related to U.S. patent application Ser. No. 09/957,820, entitled "Method and Apparatus for Coding Bits of Data in Parallel," filed on Sep. 20, 2001, now U.S. Pat. No. 6,701,482, issued Mar. 2, 2004 to Salvi et al., assigned to the assignee hereof, and hereby expressly incorporated by reference.

BACKGROUND OF THE INVENTION

1. Field of the Invention

The present invention relates to data communications. More particularly, the present invention relates to coding multiple bits of data in parallel (e.g., using a multiple-port memory) to significantly reduce delays associated with coding.

2. Description of the Related Art

In a typical digital communications system, data is processed, modulated, and conditioned at a transmitter unit to generate a modulated signal that is then transmitted to one or more receiver units. The data processing may include, for example, formatting the data into a particular frame format, coding the formatted data with a particular coding scheme to provide error detection and/or correction at the receiver units, channelizing (i.e., covering) the coded data, and spreading the channelized data over the system bandwidth. The data processing is typically defined by the system or standard being implemented.

At the receiver unit, the transmitted signal is received, conditioned, demodulated, and digitally processed to recover the transmitted data. The processing at the receiver unit is complementary to that performed at the transmitter unit and may include, for example, despreading the received samples, decovering the despread samples, and decoding the decovered symbols to recover the transmitted data.

The ability to correct transmission errors enhances the reliability of a data transmission. Many digital communications systems employ a convolutional code or a Turbo code to provide error correction capability at the receiver units. Convolutional codes operate on serial data, one or a few bits at a time. There are a variety of useful convolutional codes, and a variety of algorithms for decoding the received coded information sequences to recover the original data. Turbo coding specifically is a parallel-concatenated convolutional coding scheme. A concatenated code is a cascaded combination of two or more codes and is used to provide additional error correction capabilities. For a concatenated code, the code bits between the coding stages may be interleaved (i.e., reordered) to provide temporal diversity, which can further improve performance. An entire packet or frame of code bits is typically stored before the reordering is performed. The reordered code bits are then serially retrieved and coded by the next coding stage.

Conventionally, convolutional and Turbo coding is performed serially on an input bit stream. For each clock cycle, one data bit is provided to the encoder and two or more code bits are generated depending on the code rate of the encoder. Some of the code bits may then be punctured (i.e., deleted) to obtain code bits at other code rates.

Digital multiple access communications systems typically transmit data in packets or frames to allow for efficient sharing of system resources among active users. For services that cannot tolerate long delays (e.g., voice, video), the packets are selected to be short in duration (e.g., 10 msec) and the codes are accordingly selected to have shorter processing delays. However, for improved coding efficiency, it is desirable to process and code larger sized packets, which can result in longer processing delays using the conventional technique that serially codes data. The long processing delays may adversely impact the performance of the communications system. For example, a particular user or data rate may be selected for a particular data transmission based on the conditions of the communications link. If the processing delays are excessively long, the link conditions may have changed by the time of the data transmission, and performance may be compromised or adversely affected.

As can be seen, techniques that can be used to efficiently code data with shorter processing delays are highly desirable.

SUMMARY OF THE INVENTION

According to one aspect, a method of generating addresses for an interleaver in a wireless communication system includes incrementing a counter to a counter value, the counter value for generating an interleaver address, if the counter value corresponds to an invalid interleaver address, adjusting the counter value to a next valid address, and generating an address based on the adjusted counter value.

In another aspect, an address generation apparatus for an interleaver in a wireless communication system including a counter, and a plurality of address generators each coupled to the counter, each of the plurality of address generators having a memory storage device coupled to the counter, storing a plurality of counter values with corresponding counter offset values, and a second counter coupled to the memory storage device, adapted to add the counter offset value to a previously generated address.

In still another aspect, a data encoder includes a plurality of memories for storing sequential input information bits, a plurality of interleavers for scrambling the input information bits, a first encoder coupled to a first of the memories, the first encoder adapted to encode the sequential input information bits, and a second encoder coupled to the plurality of memories, the second encoder adapted to encode the interleaved input information bits.

In yet another aspect, a method of encoding data includes receiving a plurality of input bits, and during a single system clock cycle: calculating a first set of state values based on the plurality of input bits, calculating a second set of state values based on the plurality of input bits and the first set of state values, calculating a third set of state values based on the plurality of input bits, and the first and second sets of state values, and generating a set of encoded outputs based on the first, second, and third sets of state values.

Other aspects and embodiments of the invention are described below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein:

FIGS. 7B and 7C are diagrams of an interface between an outer convolutional encoder and an interleaver without and with puncturing, respectively, according to various embodiments;

FIG. 17 is a functional diagram of address generation for a turbo encoder interleaver.

DETAILED DESCRIPTION OF VARIOUS EMBODIMENTS

Coding Multiple Bits in Parallel

Figure 1:
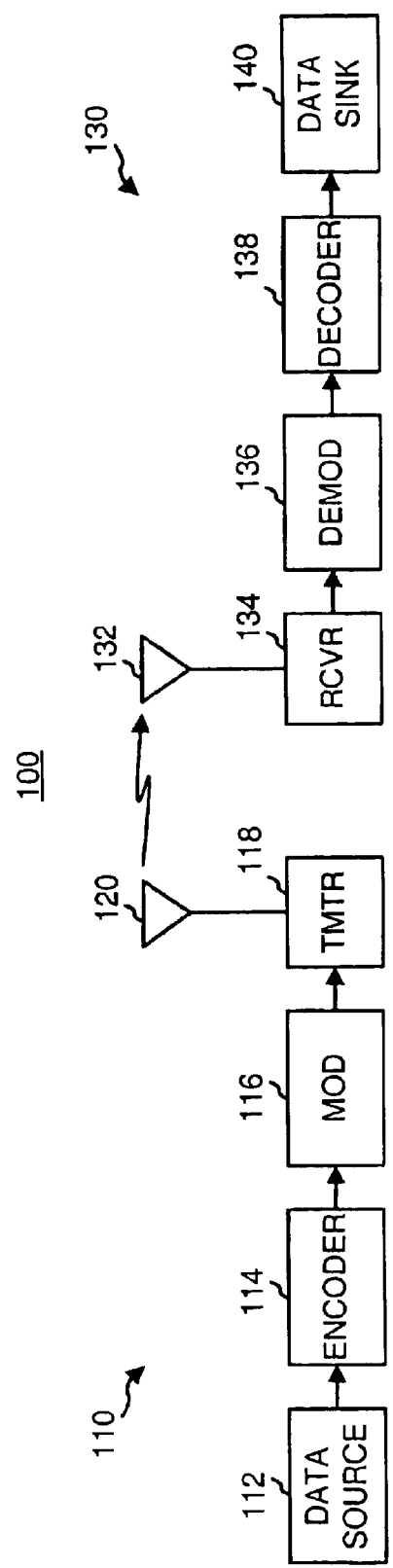
FIG. 1 is a block diagram of a communications system.

FIG. 1 is a simplified block diagram of an embodiment of a communications system 100 in which various aspects of the present invention may be implemented. At a transmitter unit 110, traffic data is sent, typically in packets or frames, from a data source 112 to an encoder 114 that formats and codes the data using a particular coding scheme. Encoder 114 typically further performs interleaving (i.e., reordering) of the code bits. A modulator (MOD) 116 then receives, channelizes (i.e., covers), and spreads the coded data to generate symbols that are then converted to one or more analog signals. The analog signals are filtered, (quadrature) modulated, amplified, and upconverted by a Transmitter (TMTR) 118 to generate a modulated signal, which is then transmitted via an antenna 120 to one or more receiver units.

At a receiver unit 130, the transmitted signal is received by an antenna 132 and provided to a Receiver (RCVR) 134. Within receiver 134, the received signal is amplified, filtered, downconverted, quadrature demodulated, and digitized to provide samples. The samples are despread, decovered, and demodulated by a Demodulator (DEMOD) 136 to generate demodulated symbols. A decoder 138 then decodes the demodulated symbols and (possibly) reorders the decoded data to recover the transmitted data. The processing performed by demodulator 136 and decoder 138 is complementary to the processing performed at transmitter unit 110. The recovered data is then provided to a data sink 140.

The signal processing described above supports transmissions of voice, video, packet data, messaging, and other types of communication in one direction. A bi-directional communications system supports two-way data transmission. However, the signal processing for the other direction is not shown in FIG. 1 for simplicity.

Communications system 100 can be a Code Division-Multiple Access (CDMA) system, a Time Division-Multiple Access (TDMA) communications system (e.g., a GSM system), a Frequency Division-Multiple Access (FDMA) communications system, or other multiple access communications system that supports voice and data communication between users over a terrestrial link.

The use of CDMA techniques in a multiple access communications system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS," and U.S. Pat. No. 5,103,459, entitled "SYSTEM AND METHOD FOR GENERATING WAVEFORMS IN A CDMA CELLULAR TELEPHONE SYSTEM." Another specific CDMA system is disclosed in U.S. patent application Ser. No. 08/963,386, entitled "METHOD AND APPARATUS FOR HIGH RATE PACKET DATA TRANSMISSION," filed Nov. 3, 1997 now U.S. Pat. No. 6,574,211, issued Jun. 3, 2003 to Padovani et al. (hereinafter referred to as the High Data Rate (HDR) system). These patents and patent application are assigned to the assignee of the present invention and incorporated herein by reference.

CDMA systems are typically designed to conform to one or more standards such as the "TIA/EIA/IS-95-A Mobile Station-Base Station Compatibility Standard for Dual-Mode Wideband Spread Spectrum Cellular System" (hereinafter referred to as the IS-95-A standard), the "TIA/EIA/IS-98 Recommended Minimum Standard for Dual-Mode Wideband Spread Spectrum Cellular Mobile Station" (hereinafter referred to as the IS-98 standard), the standard offered by a consortium named "3rd Generation Partnership Project" (3GPP) and embodied in a set of documents including Document Nos. 3G TS 25.211, 3G TS 25.212, 3G TS 25.213, and 3G TS 25.214 (hereinafter referred to as the W-CDMA standard), and the "TR-45.5 Physical Layer Standard for cdma2000 Spread Spectrum Systems" (hereinafter referred to as the CDMA-2000 standard). New CDMA standards are continually proposed and adopted for use. These CDMA standards are incorporated herein by reference.

Figure 2:
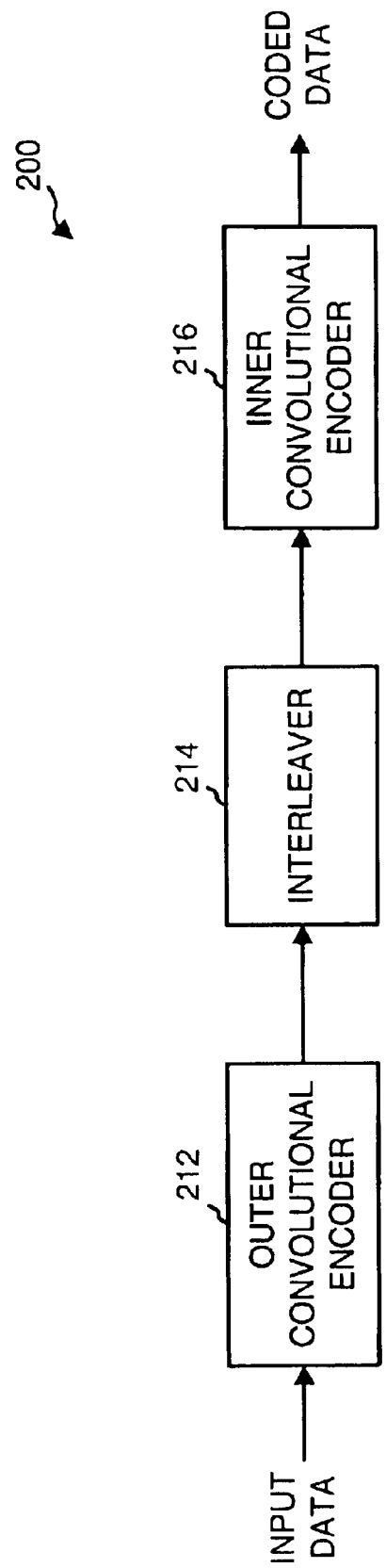
FIG. 2 is a serially concatenated encoder according to one embodiment.

FIG. 2 is a block diagram of an encoder 200 that can be designed to implement some embodiments of the present invention. Encoder 200 may be used for encoder 114 in FIG. 1. In this embodiment, encoder 200 implements a concatenated code and includes an outer convolutional encoder 212, an interleaver 214, and an inner convolutional encoder 216 coupled in cascade. Outer convolutional encoder 212 receives and convolutionally codes the input data to generate code bits, which are provided to interleaver 214 for storage. Once an entire packet of code bits has been stored in interleaver 214, the code bits are retrieved and provided to inner convolutional encoder 216. To achieve the interleaving, the code bits are read out in an order that is different from the order in which the bits are written to interleaver 214. Outer convolutional encoder 212 receives and convolutionally codes the code bits to generate coded data, which is then provided to the subsequent processing stage.

A conventional convolutional encoder receives and codes data serially, one bit at a time (i.e., per clock cycle). For communications systems that transmit data in large packets, the serial coding of data can result in long processing delays. Moreover, for a concatenated coder made up of multiple convolutional encoders coupled in cascade, the processing delays can be excessively long, especially if the outer and inner convolutional encoders both code bits serially.

In one aspect, a convolutional encoder is capable of receiving and coding multiple (M) bits in parallel. This capability allows the convolutional encoder to code a packet of data in approximately $(1/M)^{th}$ the amount of time required by a conventional convolutional encoder. The benefits are more pronounced for a concatenated coder (e.g., a Turbo coder) when each of the individual convolutional encoders processes bits in parallel.

According to another aspect, an interleaver is capable of storing and providing multiple bits of data in parallel. The interleaver may be implemented using, for example, a multi-port memory. When used in combination with the convolutional encoders described herein, the interleaver can further reduce the processing delays since data can be written to, and read from the interleaver in a fraction of the time.

For clarity, an exemplary embodiment is now described for an encoder used for a downlink data transmission in the communications system described in the aforementioned U.S. patent application Ser. No. 08/963,386, now U.S. Pat. No. 6,574,211 (i.e., the HDR system). The HDR system employs a concatenated code comprised of an outer convolutional code, interleaving, and an inner convolutional code. The HDR system also defines two packet formats having the properties listed in Table 1.

TABLE 1

| Parameters | Packet Format 1 | Packet Format 2 | Units |
|---|---|---|---|
| Total bits/packet | 1024 | 2048 | bits |
| Outer convolutional encoder | | | |
| Input data bits/packet | 1018 | 2042 | bits |
| Code-tail bits/packet | 4 | 4 | bits |
| Outer code rate | ½ | ⅔ | |
| Outer code puncture pattern | (1111) | (1011) | |
| Output code bits/packet | 2044 | 3069 | bits |
| Interleaver depth | 2048 | 3072 | bits |
| Inner convolutional encoder | | | |
| Input code bits/packet | 2044 | 3069 | bits |
| Code-tail bits/packet | 4 | 3 | bits |
| Inner code rate | ½ | ¾ | |
| Inner code puncture pattern | (111111) | (111001) | |
| Output code bits/packet | 4096 | 4096 | bits |
| Overall code rate | ¼ | ½ | |

In the HDR system, the outer convolutional encoder implements a rate ½ convolutional code defined by the following polynomial generator matrix:

$$G_O(x) = \left[1, \frac{x^4 + x^2 + x + 1}{x^4 + x^3 + 1}\right].\qquad \text{Eq (1)}$$

The inner convolutional encoder in the HDR system implements a rate ½ convolutional code defined by the following polynomial generator matrix:

$$G_I(x) = \left[1, \frac{x^2 + x + 1}{x + 1}\right].\qquad \text{Eq (2)}$$

Figure 3:
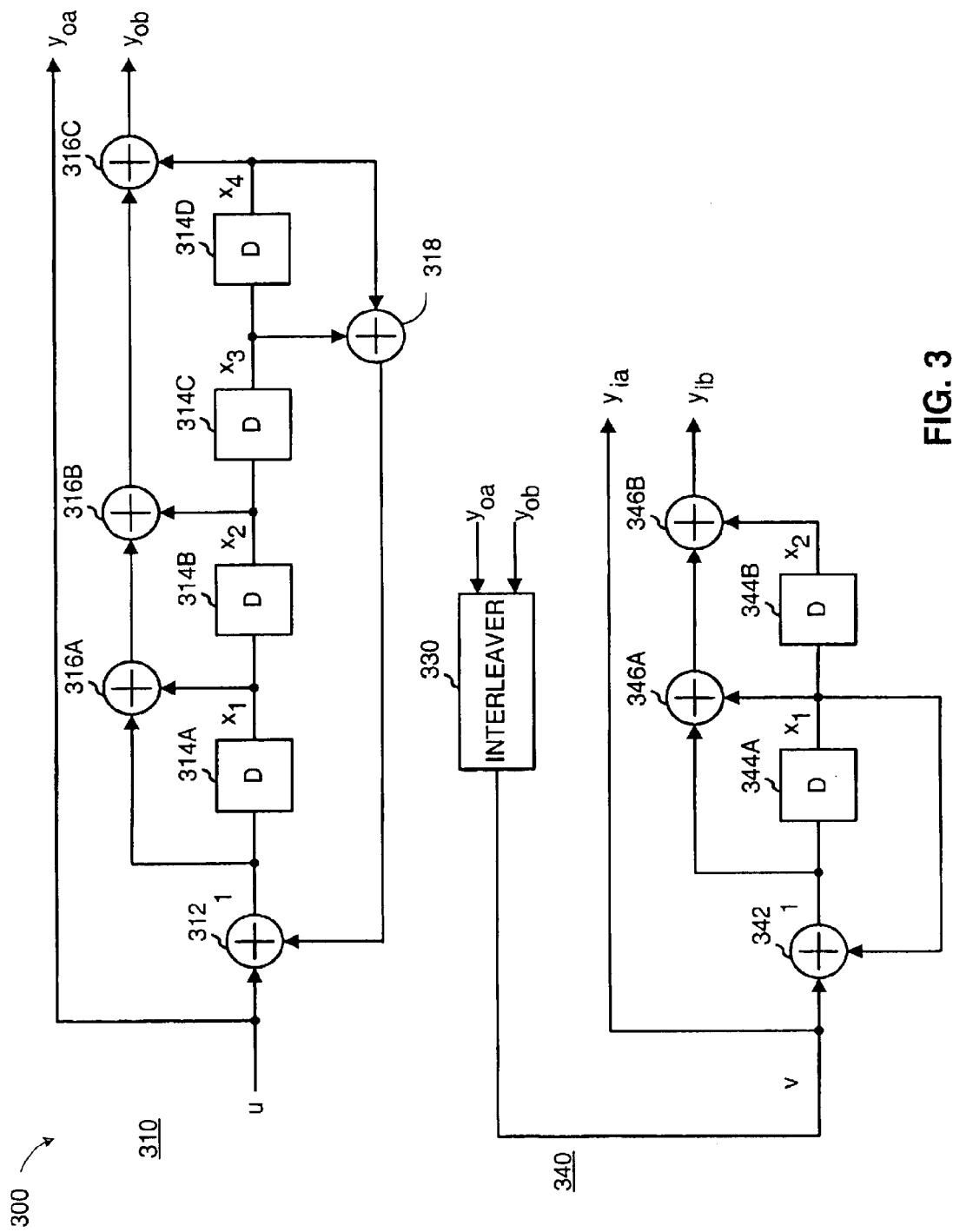
FIG. 3 is a diagram of a concatenated encoder which implements a particular set of polynomial generator matrices according to one embodiment.

FIG. 3 is a diagram of an encoder 300 that implements the outer and inner convolutional codes defined by equations (1) and (2). The data bits u are provided to an outer convolutional encoder 310 that implements equation (1) and generates two outputs $y_{oa}$ and $y_{ob}$. Within encoder 310, the data bits u are provided to a summer 312 that further couples in cascade with registers 314A through 314D (which are used to implement a set of delays). The outputs from summer 312 and registers 314A, 314B, and 314D are summed by summers 316A, 316B, and 316C to implement the numerator of the second element in the polynomial generator matrix expressed in equation (1). The outputs from registers 314C and 314D are summed by a summer 318 and provided to summer 312 to implement the denominator of the second element in equation (1). The input data bits u are provided as the first output $y_{oa}$ and the output from summer 316C comprises the second output $y_{ob}$.

The code bits in the outputs $y_{oa}$ and $y_{ob}$ of outer convolutional encoder 310 may be punctured (not shown in FIG. 3 for simplicity). The unpunctured code bits are then provided to interleaver 330 and reordered. The reordered code bits v are then provided to an inner convolutional encoder 340 that implements equation (2) and generates two outputs $y_{ia}$ and $y_{ib}$. Within encoder 340, the code bits v are provided a summer 342 that couples in cascade with registers 344A and 344B. The outputs from summer 342 and registers 344A and 344B are summed by summers 346A and 346B to implement the numerator of the second element in the polynomial generator matrix expressed in equation (2). The output from register 344A is provided to summer 342 to implement the denominator of the second element in equation (2). The input code bits v are provided as the first output $y_{ia}$ and the output from summer 346B comprises the second output $y_{ib}$.

Conventionally, the data bits u are provided serially to encoder 310 and the code bits v are also provided serially to encoder 340. For each input data bit, outer convolutional encoder 310 generates two code bits. Interleaver 330 receives and stores the code bits, and provides the code bits serially to inner convolutional encoder 340. The coding of the bits in a serial manner results in long processing delays.

The convolutional encoder of one embodiment is capable of coding multiple bits in parallel to significantly shorten the coding delays. For each clock cycle, multiple (e.g., M) data bits can be received and coded to generate multiple code bits. For a rate ½ encoder, 2M code bits are generated for the M data bits. M can be selected to be any number such as, for example, 4, 8, 16, 32, and so on. Various alternate embodiments of such a convolutional encoder are described below.

Many digital communications systems, such as the HDR system, transmit data in packets. The number of bits in a packet (i.e., the packet size) is selected based on a number of criteria such as, for example, the data rate, the amount of data to transmit, the processing delays requirements, and so on. To allow the decoder at the receiver unit to start at a known state at the beginning of each packet, which shortens the decoding time and improves performance, the encoder is initialized to a known state (e.g., all zeros) at the start of each packet. The initialization is achieved by inserting a set of code tail bits at the end of the preceding packet. The code-tail bits are selected such that the encoder is set to the known state.

In one embodiment, the convolutional encoder of the exemplary embodiment is implemented with a look-up table. Referring to FIG. 3, outer convolutional encoder 310 may be viewed as a state machine with a 4-bit state defined by the outputs of registers 314A through 314D. To generate the contents of the look-up table, the M input data bits at time index n can be represented by a vector $U_n$, the 2M code bits can be represented by a vector $Y_n$, and the current encoder state can be represented by a vector $X_n$. The next state $X_{n+1}$ for the encoder and the encoder output vector $Y_n$ can be expressed as:

| Data | | Code-tail | | |
| --- | --- | --- | --- | --- |
| $X_{n+1} = f(X_n, U_n)$ | | $X_{n+1} = 0$ | | Eq (3) |
| $Y_n = g_1(X_n, U_n)$ | | $Y_n = g_2(X_n, U_n)$ | | Eq (4) |

Each of equations (3) and (4) provides one equation to use when the input is data and another equation to use when the encoder input includes code-tail bits.

Equations (3) and (4) can be computed for all possible combinations of input data bits and encoder states. For example, for equation (4), the output code bits can be computed for the input vector $U_n = 0 \ldots 00$ and an encoder state of $X_n = 0 \ldots 00$, an input vector $U_n = 0 \ldots 01$ and the encoder state of $X_n = 0 \ldots 00$, and so on, and an input vector $U_n = 1 \ldots 11$ and the encoder state of $X_n = 0 \ldots 00$. The output code bits can then be computed for all possible combination of the input vector $U_n$ and an encoder state of $X_n = 0 \ldots 01$. The process then continues until all combinations of input vector and encoder state are computed. Equation (3) can also be computed in a similar manner.

The results from the computations for equations (3) and (4) can be stored to a memory that implements a look-up table. The required memory size is dependent on the number of data bits to be coded in parallel and the particular polynomial generator matrix being implemented. For example, if eight data bits are to be coded in parallel with the convolutional code expressed in equation (1), a memory having a size of 12 address bits and 20 data bits (i.e., 4096×20) can be used. The 12-bit address is composed of 8 input data bits and 4 bits for the current encoder state. The 20-bit output includes 16 code bits and 4 bits for the next encoder state.

Once the memory has been properly defined, the input data vector $U_n$ and the current encoder state $X_n$ can be provided to the address input of the memory, which then provides the output vector $Y_n$ and the next encoder state $X_{n+1}$. The next encoder state $X_{n+1}$ is appropriately stored for use with the next input data vector $U_{n+1}$.

In another embodiment, the convolutional encoder is implemented with a state machine. The encoder state and output can be expressed as shown in equations (3) and (4). Each of equations (3) and (4) can be recursively solved, and the resulting equations are then implemented in hardware, software, or a combination thereof. The recursive equations for the encoder may be solved as follows. Let $X_n^T = [x_4 \, x_3 \, x_2 \, x_1]$ denotes the transposed state vector and $u_0$ denotes the input data bit at time index 0. The next state and output of the encoder can then be expressed as:

$$X_1 = AX_0 + Bu_0, \quad \text{Eq (5)}$$

$$y_0 = CX_0 + Du_0. \quad \text{Eq (6)}$$

where A, B, C, and D are scalar, vectors, and matrix that are dependent on the particular polynomial generator matrix being implemented. The encoder state equation (5) can be recursively solved as follows:

$$X_2 = A^2 X_0 + ABu_0 + Bu_1$$

$$X_3 = A^3 X_0 + A^2 Bu_0 + ABu_1 + Bu_2$$

$$\vdots$$

$$X_8 = A^8 X_0 + A^7 Bu_0 + A^6 Bu_1 + A^5 Bu_2 +$$
$$A^4 Bu_3 + A^3 Bu_4 + A^2 Bu_5 + ABu_6 + Bu_7$$

The encoder output equation (6) can also be recursively solved in similar manner.

Equations (5) and (6) are used to code one data bit u at a time. A similar set of equations can be derived for coding M data bits in parallel. For example, for coding 8 data bits in parallel (i.e., M=8), the transpose of the input data vector at time index n can be defined as $U_n^T = [u_{n7} \, u_{n6} \, u_{n5} \, u_{n4} \, u_{n3} \, u_{n2} \, u_{n1} \, u_{n0}]$, and the transpose of the output code vector can be defined as $Y_n^T = [y_{n7} \, y_{n6} \, y_{n5} \, y_{n4} \, y_{n3} \, y_{n2} \, y_{n1} \, y_{n0}]$. Using the defined vector notations for $U_n$ and $Y_n$, equations (5) and (6) can be expressed as:

$$X_{n+1} = FX_n + GU_n, \quad \text{Eq (7)}$$

$$Y_n = HX_n + IU_n. \quad \text{Eq (8)}$$

where F, G, H, and I are vectors and matrices that are dependent on the particular polynomial generator matrix being implemented, the current encoder state $X_n$, and the input data vector $U_n$. Equation (7) is used to generate the next encoder state $X_{n+1}$ after M data bits have been coded, and equation (8) is used to generate the encoder outputs $Y_n$ for the input vector $U_n$.

To determine F, G, H, and I in equations (7) and (8), equations (5) and (6) can be solved recursively using various techniques and the results from the recursive computations can be used to implement equations (7) and (8). For example, a table can be used to tabulate the state and outputs of the encoder for each input data bit. The entries in the table can then be used to implement equations (7) and (8), as described below.

Table 2 shows the encoder states and outputs after eight input data bits $u_0$ through $u_7$ have been serially provided to convolutional encoder 310 in FIG. 3, which implements equation (1). As shown in FIG. 3, registers 314A through 314D initially store the values of $x_1$, $x_2$, $x_3$, and $x_4$, respectively. On the first clock cycle, the first data bit $u_0$ is provided to encoder 310, and the output of summer 312 is computed as $x_4 + x_3 + u_0$, which is stored in the second row, second column in Table 2. The encoder outputs are computed as $y_{a0} = u_0$ and $y_{b0} = (x_4 + x_3 + u_0) + x_4 + x_2 + x_1 = x_3 + x_2 + x_1 + u_0$. (Each summer 316 performs modulo-2 addition.) On the next clock cycle, the values from summer 312 and registers 314A through 314C are shifted into regissters 314A through 314D, respectively. The next data bit $u_1$ is provided to the encoder, and the output of summer 312 is computed as $x_3 + x_2 + u_1$, which is stored in the third row, second column in Table 2. The encoder outputs are computed as $y_{a1} = u_1$ and $y_{b2} = (x_3 + x_2 + u_1) + x_3 + x_1 + (x_4 + x_3 + u_0) = x_4 + x_3 + x_2 + x_1 + u_0 + u_1$. The processing continues until the eighth data bit $u_7$ is received and processed.

The encoder output vector $Y_b = [y_{b7} \, y_{b6} \, y_{b5} \, y_{b4} \, y_{b3} \, y_{b2} \, y_{b1} \, y_{b0}]$ corresponds to the input vector $U = [u_7 \, u_6 \, u_5 \, u_4 \, u_3 \, u_2 \, u_1 \, U_0]$ and is generated based on the entries in the last column in Table 2. The encoder state $X_{n+1}$ after the eighth data bit $u_7$ has been coded is generated based on the entries in the last row in Table 2. As shown in Table 2, the encoder output vector $Y_b$ and the next encoder state $X_{n+1}$ are each a function of the current encoder state $X_n=[x_4\ x_3\ x_2\ x_1]$ and the input vector U. For the data phase, the encoder output vector $Y_a$ is simply a function of the input vector U (i.e., $Y_a=U$).

two data bits, $u_0$ and $u_1$, are serially provided to the encoder. The encoder states $x_1$ through $x_4$ and the encoder outputs $y_c$ and $y_d$ are computed in similar manner as described above.

TABLE 2

| u | 1 | $x_1$ | $x_2$ | $x_3$ | $x_4$ | $y_a$ | $y_b$ |
|---|---|---|---|---|---|---|---|
| $u_0$ | $x_4 + x_3 + u_0$ | $x_1$ | $x_2$ | $x_3$ | $x_4$ | $u_0$ | $x_3 + x_2 + x_1 + u_0$ |
| $u_1$ | $x_3 + x_2 + u_1$ | $x_4 + x_3 + u_0$ | $x_1$ | $x_2$ | $x_3$ | $u_1$ | $x_4 + x_3 + x_2 + x_1 + u_0 + u_1$ |
| $u_2$ | $x_2 + x_1 + u_2$ | $x_3 + x_2 + u_1$ | $x_4 + x_3 + u_0$ | $x_1$ | $x_2$ | $u_2$ | $x_4 + x_2 + x_1 + u_0 + u_1 + u_2$ |
| $u_3$ | $x_4 + x_3 + x_1 + u_0 + u_3$ | $x_4 + x_3 + x_1 + u_0 + u_3$ | $x_3 + x_2 + u_1$ | $x_4 + x_3 + u_0$ | $x_1$ | $u_3$ | $x_4 + x_1 + u_0 + u_1 + u_2 + u_3$ |
| $u_4$ | $x_4 + x_2 + u_0 + u_1 + u_4$ | $x_4 + x_2 + u_0 + u_1 + u_4$ | $x_4 + x_3 + x_1 + u_0 + u_3$ | $x_3 + x_2 + u_1$ | $x_4 + x_3 + u_0$ | $u_4$ | $x_4 + u_0 + u_1 + u_2 + u_3 + u_4$ |
| $u_5$ | $x_3 + x_1 + u_1 + u_2 + u_5$ | $x_4 + x_2 + u_0 + u_1 + u_4$ | $x_4 + x_2 + u_0 + u_1 + u_4$ | $x_4 + x_3 + x_1 + u_0 + u_3$ | $x_3 + x_2 + u_1$ | $u_5$ | $x_3 + u_1 + u_2 + u_3 + u_4 + u_5$ |
| $u_6$ | $x_4 + x_3 + x_2 + u_0 + u_2 + u_3 + u_6$ | $x_3 + x_1 + u_1 + u_2 + u_5$ | $x_4 + x_2 + u_0 + u_1 + u_4$ | $x_4 + x_2 + u_0 + u_1 + u_4$ | $x_4 + x_3 + x_1 + u_0 + u_3$ | $u_6$ | $x_2 + u_2 + u_3 + u_4 + u_5 + u_6$ |
| $u_7$ | $x_3 + x_2 + x_1 + u_1 + u_3 + u_4 + u_7$ | $x_4 + x_3 + x_2 + u_0 + u_2 + u_3 + u_6$ | $x_3 + x_1 + u_1 + u_2 + u_5$ | $x_4 + x_2 + u_0 + u_1 + u_4$ | $x_4 + x_2 + u_0 + u_1 + u_4$ | $u_7$ | $x_1 + u_3 + u_4 + u_5 + u_6 + u_7$ |
| | | $x_3 + x_2 + x_1 + u_1 + u_3 + u_4 + u_7$ | $x_4 + x_3 + x_2 + u_0 + u_2 + u_3 + u_6$ | $x_3 + x_1 + u_1 + u_2 + u_5$ | $x_4 + x_2 + u_0 + u_1 + u_4$ | | |

Referring back to Table 1, the outer convolutional encoder in the HDR system receives 1018 data bits and four code-tail bits for each packet in packet format 1. If eight bits are coded in parallel, 128 clock cycles are used to code one packet of data. The first 127 clock cycles are used to code 1016 data bits (i.e., 127×8=1016), and the 128$^{th}$ clock cycle is used to code the remaining two data bits and four code-tail bits. The first 127 clock cycles are referred to as the "data phase," and the last clock cycle is referred to as the "code-tail phase."

The outer convolutional encoder receives 2042 data bits and four code-tail bits for each packet in packet format 2. If eight bits are coded in parallel, 256 clock cycles are used to code one packet of data. The first 255 clock cycles are used to code 2040 data bits (i.e., 255×8=2040), and the 256$^{th}$ clock cycle is used to code the remaining two data bits and four code-tail bits. The first 255 clock cycles are referred to as the data phase, and the last clock cycle is referred to as the code-tail phase.

Thus, the second and third rows of Table 3 are identical to the second and third rows of Table 2. On the third clock cycle, the first code-tail bit having a value of $x_2+x_1$ is provided to the encoder. The value of the code-tail bit is selected such that the output of summer 312 is equal to zero, which is used to flush out the convolutional encoder. The encoder outputs are computed as $y_{c2}=x_2+x_1$ and $y_{d2}=x_4+u_0+u_1$. On the next clock cycle, the values from summer 312 and registers 314A through 314C are shifted into registers 314A through 314D, respectively. The second code-tail bit is selected to be $x_4+x_3+x_1+u_0$, again to set the output of summer 312 to zero and flush out the encoder. The processing continues, with the last two bits provided to the encoder having values of zero.

As shown in Table 3, the encoder outputs $Y_c$ and $Y_d$ are both functions of the input vector U and the current encoder state $X_n$. For the code-tail phase, the next encoder state $X_{n+1}$ is set to a known state of all zeros (i.e., $X_8=[0\ 0\ 0\ 0]$).

TABLE 3

| u | 1 | $x_1$ | $x_2$ | $x_3$ | $x_4$ | $y_c$ | $y_d$ |
|---|---|---|---|---|---|---|---|
| $u_0$ | $x_4 + x_3 + u_0$ | $x_1$ | $x_2$ | $x_3$ | $x_4$ | $u_0$ | $x_3 + x_2 + x_1 + u_0$ |
| $u_1$ | $x_3 + x_2 + u_1$ | $x_4 + x_3 + u_0$ | $x_1$ | $x_2$ | $x_3$ | $u_1$ | $x_4 + x_3 + x_2 + x_1 + u_0 + u_1$ |
| $x_2 + x_1$ | 0 | $x_3 + x_2 + u_1$ | $x_4 + x_3 + u_0$ | $x_1$ | $x_2$ | $x_2 + x_1$ | $x_4 + u_0 + u_1$ |
| $x_4 + x_3 + x_1 + u_0$ | 0 | 0 | $x_3 + x_2 + u_1$ | $x_4 + x_3 + u_0$ | $x_1$ | $x_4 + x_3 + x_1 + u_0$ | $x_3 + x_2 + x_1 + u_1$ |
| $x_4 + x_2 + u_0 + u_1$ | 0 | 0 | 0 | $x_3 + x_2 + u_1$ | $x_4 + x_3 + u_0$ | $x_4 + x_2 + u_0 + u_1$ | $x_4 + x_3 + u_0$ |
| $x_3 + x_2 + u_1$ | 0 | 0 | 0 | 0 | $x_3 + x_2 + u_1$ | $x_3 + x_2 + u_1$ | $x_3 + x_2 + u_1$ |
| 0 | 0 | 0 | 0 | 0 | 0 | 0 | 0 |
| 0 | 0 | 0 | 0 | 0 | 0 | 0 | 0 |

Figure 4:
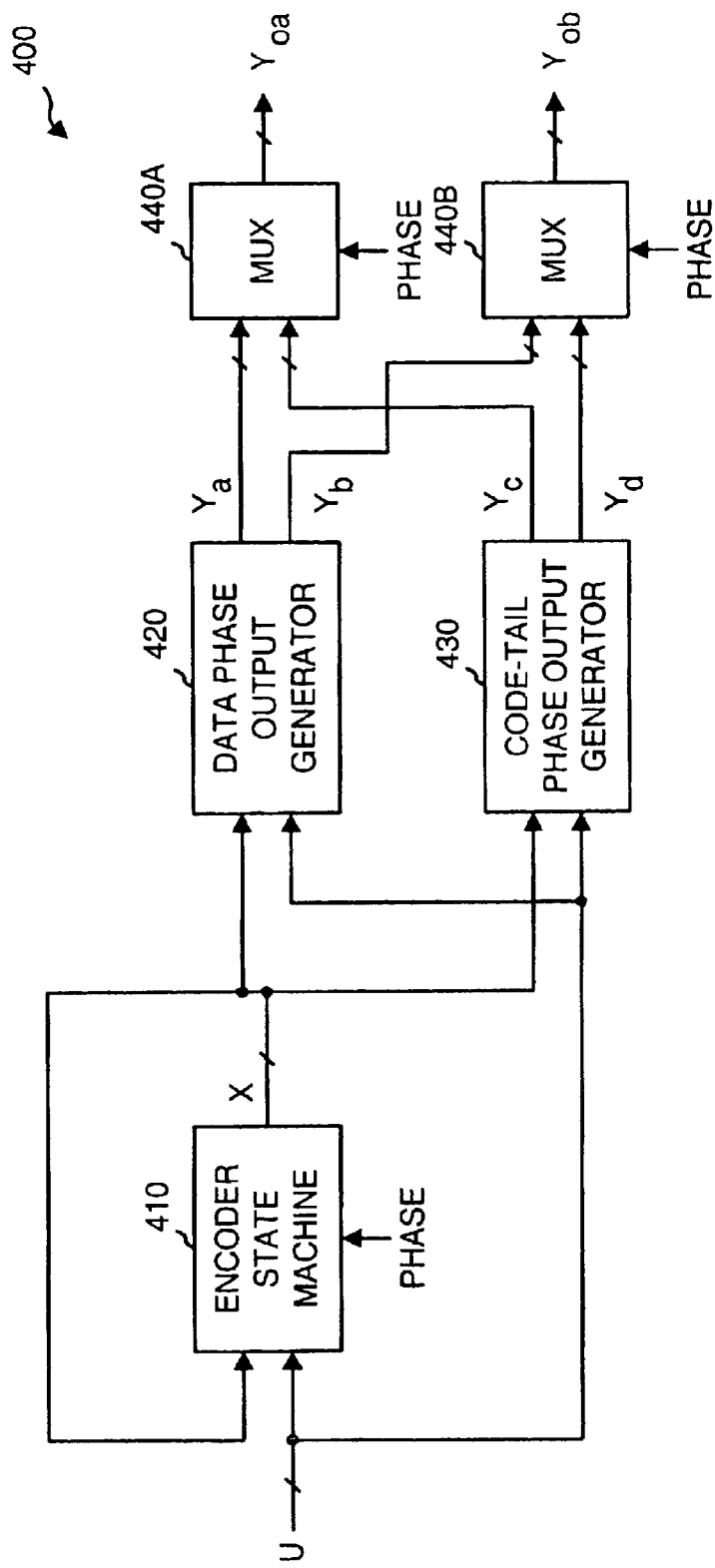
FIG. 4 is a block diagram of a convolutional encoder for coding multiple data bits in parallel according to one embodiment.

Table 3 shows the encoder states and outputs after two data bits $u_0$ and $u_1$ and four code-tail bits have been serially provided to convolutional encoder 310 in FIG. 3. Again, registers 314A through 314D initially store the values of $x_1$, $x_2$, $x_3$, and $x_4$, respectively. On the first two clock cycles, the FIG. 4 is a block diagram of an embodiment of a convolutional encoder 400 that can code multiple input data bits in parallel. Convolutional encoder 400 can be used to implement the data and code-tail phases (e.g., as defined in Tables 2 and 3, respectively). The encoder architecture shown in FIG. 4 can be used to implement, for example, outer convolutional encoder 310 or inner convolutional encoder 340 in FIG. 3.

Within convolutional encoder 400, the input data bits are provided in parallel as a data vector U to an encoder state machine 410, a data phase output generator 420, and a code-tail phase output generator 430. Encoder state machine 410 also receives the current encoder state X and determines the new encoder state based on the received inputs vector U and the current encoder state X. Encoder state machine 410 can implement, for example, the last row in Table 2.

Data phase output generator 420 and code-tail phase output generator 430 also receive the current encoder state X and determine the encoder outputs for the data phase and the code-tail phase, respectively, based on the received inputs X and U. Data phase output generator 420 can implement, for example, the last two columns in Table 2, and code-tail output generator 430 can implement, for example, the last two columns in Table 3. The first and second outputs, $Y_a$ and $Y_b$, from data phase output generator 420 are provided to multiplexers (MUXes) 440A and 440B, respectively. Similarly, the first and second outputs, $Y_c$ and $Y_d$, from code-tail phase output generator 430 are provided to multiplexers 440A and 440B, respectively. Multiplexers 440A and 440B provide the outputs $Y_a$ and $Y_b$, respectively, from data phase output generator 420 when operating in the data phase and the outputs $Y_c$ and $Y_d$, respectively, from code-tail phase output generator 430 when operating in the code-tail phase.

To implement a convolutional encoder that continuously codes input data bits as they are received, without having to reset the encoder state at the start of each packet, only encoder state machine 410 and data phase output generator 420 are needed. For communications systems (e.g., the HDR system) in which data is sent in packets and code-tail bits are used to reset the convolutional encoder to a known state at the start of each packet, code-tail phase output generator 430 and multiplexers 440 are used to provide the required encoder outputs.

The design of encoder state machine 410 and data phase output generator 420 is dependent on the particular polynomial generator matrix to be implemented and the number of data bits to be coded in parallel. The design of code-tail phase output generator 430 is dependent on the polynomial generator matrix, the number of data bits to be coded in parallel, and the particular frame format (i.e., the number of data and code-tail bits to be coded in the code-tail phase). A specific design of convolutional encoder 400 is now described below.

Figure 5A:
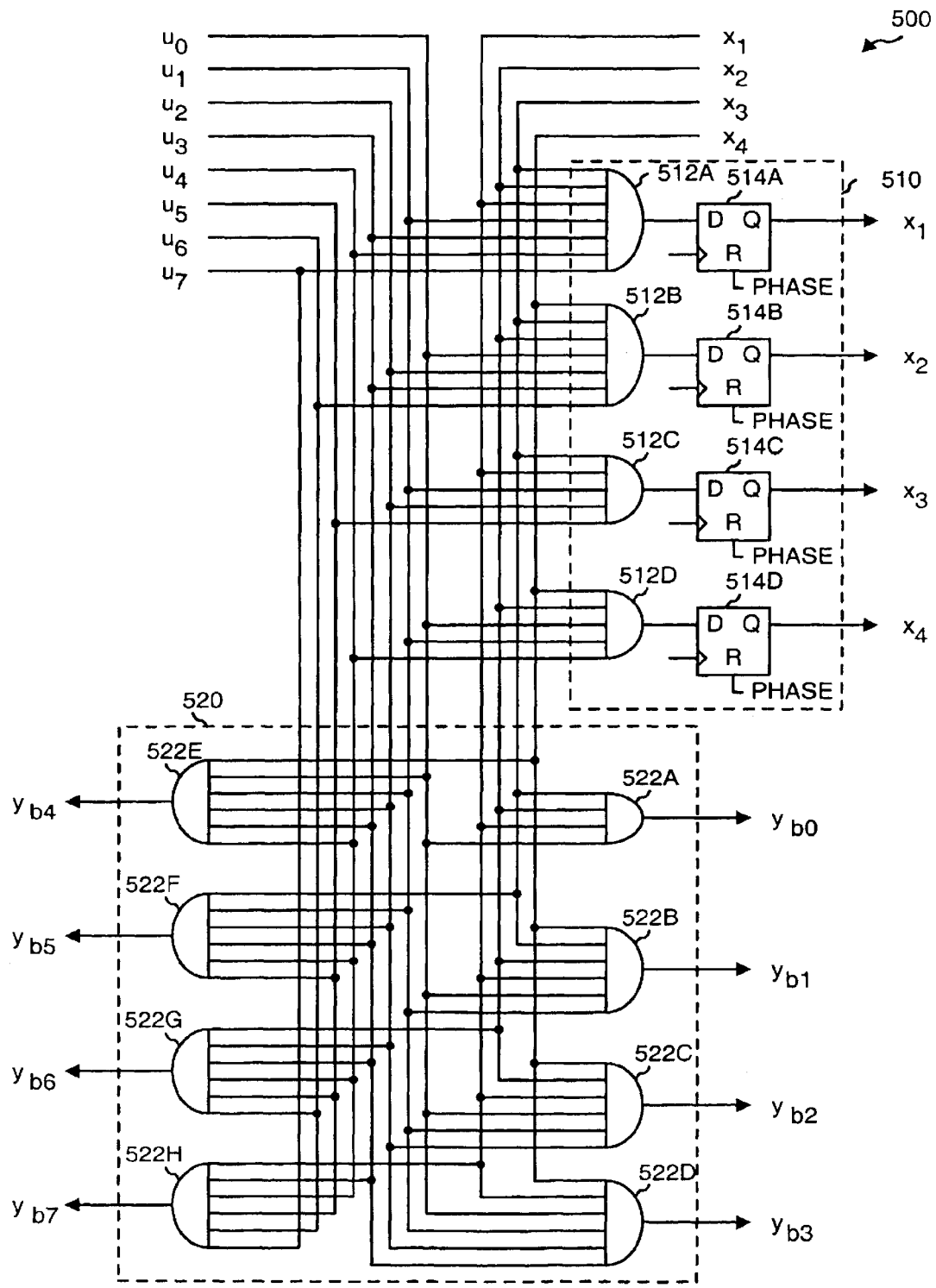
FIGS. 5A and 5B are schematic diagrams of a convolutional encoder which implements a specific polynomial generator matrix and for coding eight data bits in parallel according to various embodiments.

FIG. 5A is a schematic diagram of a specific embodiment of a convolutional encoder 500 that can code eight input data bits in parallel and implements the polynomial generator matrix expressed in equation (1). Convolutional encoder 500 includes an encoder state machine 510 that implements the state machine defined in Table 2 and a data phase output generator 520 that generates the encoder outputs defined in Table 2. Encoder state machine 510 and data phase output generator 520 corresponds to encoder state machine 410 and data phase output generator 420, respectively, in FIG. 4. In this embodiment, encoder state machine 510 is implemented with AND gates 512A through 512D and registers 514A through 514D, and data phase output generator 520 is implemented with AND gates 522A through 522H.

As shown in FIG. 5A, the eight input data bits, $u_0$ through $u_7$, are provided in parallel to the inputs to encoder state machine 510 and data phase output generator 520, each of which also receives the current encoder state defined by $x_1$ through $x_4$. Each AND gate 512 within encoder state machine 510 selectively couples to the inputs $u_0$–$u_7$ and $x_1$–$x_4$, as defined by the last row in Table 2. For example, AND gate 512A couples to the inputs $x_3$, $x_2$, $x_1$, $u_1$, $u_3$, $u_4$, and $u_7$, as defined by the entry in the last row, third column ($x_1$) in Table 2. The outputs of AND gates 512A through 512D couple to the inputs of registers 514A through 514D, respectively. The outputs of registers 514A through 514D comprise the state machine outputs $x_1$ through $x_4$, respectively.

Similarly, each AND gate 522 within data phase output generator 520 selectively couples to the inputs $u_0$–$u_7$ and $x_1$–$x_4$, as defined by the last column in Table 2. For example, AND gate 522A couples to the inputs $x_3$, $x_2$, $x_1$, and $u_0$, as defined by the entry in the second row, last column ($y_{b0}$) in Table 2. The inputs $u_0$ through $u_7$ comprise the encoder outputs $y_{a0}$ through $y_{a7}$, respectively (not shown in FIG. 5A for simplicity), and the outputs of AND gates 522A through 522H comprise the encoder outputs $y_{b0}$ through $y_{b7}$, respectively.

Figure 5B:
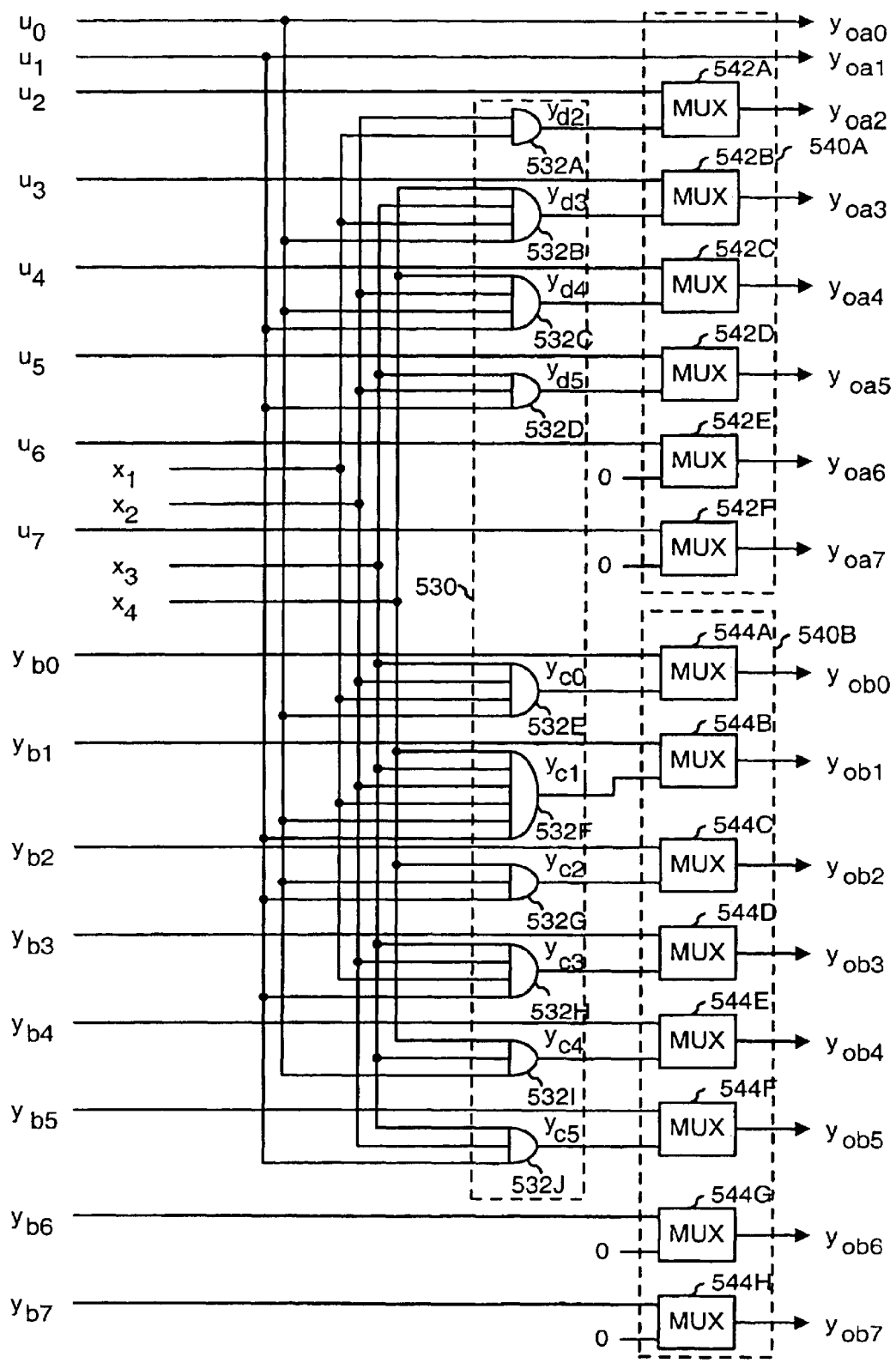

FIG. 5B is a schematic diagram of a specific embodiment of a code-tail phase output generator 530 and multiplexers 540A and 540B that implement the code-tail phase of the polynomial generator matrix expressed in equation (1) and for packet formats 1 and 2 shown in Table 1. Code-tail phase output generator 530 and multiplexers 540A and 540B correspond to code-tail phase output generator 430 and multiplexers 440A and 440B, respectively, in FIG. 4. In this embodiment, code-tail phase output generator 530 is implemented with AND gates 532A through 532J and generates the encoder outputs $Y_c$ and $Y_d$ for the code-tail phase defined in Table 3. Multiplexer 540A is implemented with 2×1 multiplexers 542A through 542F and provides the first encoder output $Y_{oa}$. Similarly, multiplexer 540B is implemented with 2×1 multiplexers 544A through 544H and provides the second encoder output $Y_{ob}$.

Encoder state machine 510, data phase output generator 520, code-tail phase output generator 530, and multiplexers 540A and 540B in FIGS. 5A and 5B form a specific implementation of convolutional encoder 400. This specific implementation is used to implement the polynomial generator matrix expressed in equation (1) and for the packet formats described in Table 1.

For packet format 1, 1018 data bits are provided to convolutional encoder 500 over 128 clock cycles. For each of the first 127 clock cycles, eight data bits are provided to encoder 500, and multiplexers 540A and 540B are selected to provide the outputs $Y_a$ and $Y_b$ from data phase output generator 520. On the 128$^{th}$ clock cycle, the remaining two data bits, four code-tail bits, and two zeros are provided to encoder 500. Registers 514A through 514D are reset to zero (synchronously), and multiplexers 540A and 540B are selected to provide the outputs $Y_c$ and $Y_d$ from code-tail phase output generator 530. For packet format 2, 2042 data bits are provided to convolutional encoder 500 over 256 clock cycles. For each of the first 255 clock cycles, corresponding to the data phase, eight data bits are coded in parallel and multiplexers 540A and 540B provide the outputs $Y_a$ and $Y_b$, respectively. On the 256$^{th}$ clock cycle, corresponding to the code-tail phase, two data bits, four code-tail bits, and two zeros are coded in parallel and multiplexers 540A and 540B provide the outputs $Y_c$ and $Y_d$, respectively.

The specific implementation shown in FIGS. 5A and 5B is described to provide a clearer understanding. It will be noted that different implementations can also be contemplated and are within the scope of the present invention.

Moreover, a different design is typically used for a different polynomial generator matrix, a different number of input data bits, or different packet formats.

In similar manner, another convolutional encoder can be designed to implement the polynomial generator matrix expressed in equation (2). In an embodiment, the convolutional encoder is designed to receive and code four code bits in parallel. Equations (5) and (6) for the next encoder state and outputs, respectively, can be recursively solved in the manner described above.

Table 4 shows the encoder states and outputs after four input code bits $v_0$ through $v_3$ have been serially provided to convolutional encoder 340 in FIG. 3. Registers 344A and 344B initially store the values of $x_1$ and $x_2$, respectively. On the first clock cycle, the first code bit $v_0$ is provided to encoder 340, and the output of summer 342 is computed as $x_1+v_0$, which is stored in the second row, second column in Table 4. The encoder outputs are computed as $y_{e0}=v_0$ and $y_{f0}=(x_1+v_0)+x_2+x_1=x_2+v_0$. On the next clock cycle, the values from summer 312 and register 344A are shifted into registers 344A and 344B, respectively. The next code bit $v_1$ is provided to encoder 340, and the output of summer 342 is computed as $x_1+v_0+v_1$, which is stored in the third row, second column. The outputs are computed as $y_{e1}=v_1$ and $y_{f1}=(x_1+v_0+v_1)+(x_1+v_0)+x_1=x_1+v_1$. The processing continues until the fourth code bit $v_3$ is received and processed.

The encoder output vector $Y_f$ is generated based on the entries in the last column in Table 4. The encoder state $X_{n+1}$ after the fourth code bit $v_3$ has been coded is generated based on the entries in the last row in Table 4. As shown in Table 4, the encoder output vector $Y_f$ and the next encoder state $X_{n+1}$ are each a function of the current encoder state $X_n=[x_2\ x_1]$ and the input vector V. For the data phase, the encoder output vector $Y_e$ is simply a function of the input vector V.

TABLE 4

| v | 1 | $x_1$ | $x_2$ | $y_e$ | $y_f$ |
|---|---|---|---|---|---|
| $v_0$ | $x_1+v_0$ | $x_1$ | $x_2$ | $v_0$ | $x_2+v_0$ |
| $v_1$ | $x_1+v_0+v_1$ | $x_1+v_0$ | $x_1$ | $v_1$ | $x_1+v_1$ |
| $v_2$ | $x_1+v_0+v_1+v_2$ | $x_3+x_2+u_1$ | $x_1+v_0$ | $v_2$ | $x_1+v_0+v_2$ |
| $v_3$ | $x_1+v_0+v_1+v_2+v_3$ | $x_1+v_0+v_1+v_2$ | $x_3+x_2+u_1$ | $v_3$ | $x_1+v_0+v_1+v_3$ |
|  |  | $x_1+v_0+v_1+v_2$ | $x_1+v_0+v_1+v_2$ |  |  |

Referring back to Table 1, the inner convolutional encoder in the HDR system receives 2044 code bits and four code-tail bits for each packet in packet format 1. If four bits are coded in parallel, 512 clock cycles are used to code one packet. The first 511 clock cycles are used to code 2044 code bits (i.e., 511×4=2044), and the 512$^{th}$ clock cycle is used to code the four code-tail bits. The convolutional encoder receives 3079 code bits and three code-tail bits for each packet in packet format 2. If four bits are coded in parallel, 768 clock cycles are used to code one packet of data. The first 767 clock cycles are used to code 3068 code bits (i.e., 767×4=3068), and the 768$^{th}$ clock cycle is used to code the last code bit and three code-tail bits.

Table 5 shows the states and outputs of the inner convolutional encoder for the code-tail phase for packet format 1. On the first clock cycle, the first code-tail bit of having a value of $x_1$, is provided to the encoder. The code-tail bit value is selected such that the output of summer 342 is equal to zero. The encoder outputs are computed as $y_{g0}=x_1$ and $y_{h0}=x_2+x_1$. The processing continues in similar manner for the remaining three code-tail bits.

TABLE 5

| v | 1 | $x_1$ | $x_2$ | $y_g$ | $y_h$ |
|---|---|---|---|---|---|
| $x_1$ | 0 | $x_1$ | $x_2$ | $x_1$ | $x_2+x_1$ |
| 0 | 0 | 0 | $x_1$ | 0 | $x_1$ |
| 0 | 0 | 0 | 0 | 0 | 0 |
| 0 | 0 | 0 | 0 | 0 | 0 |
|  |  | 0 | 0 |  |  |

Table 6 shows the states and outputs of the inner convolutional encoder for the code-tail phase for packet format 2. On the first clock cycle, the last code bit $v_0$ is provided to the encoder, and the encoder states $x_1$ and $x_2$ and outputs $y_{i0}$ and $y_{j0}$ are computed in similar manner as described above. The second row of Table 6 is thus identical to the second row of Table 4. On the second clock cycle, the first code-tail bit having a value of $x_1+v_0$ is provided to the encoder. The code-tail bit value is selected such that the output of summer 342 is equal to zero. The encoder outputs are computed as $y_{i1}=x_1+v_0$ and $y_{j1}=v_0$. The processing continues in similar manner for the remaining code-tail bits.

TABLE 6

| v | 1 | $x_1$ | $x_2$ | $y_i$ | $y_j$ |
|---|---|---|---|---|---|
| $v_0$ | $x_1+v_0$ | $x_1$ | $x_2$ | $v_0$ | $x_2+v_0$ |
| $x_1+v_0$ | 0 | $x_1+v_0$ | $x_1$ | $x_1+v_0$ | $v_0$ |
| 0 | 0 | 0 | $x_1+v_0$ | 0 | $x_1+v_0$ |
| 0 | 0 | 0 | 0 | 0 | 0 |
|  |  | 0 | 0 |  |  |

Figure 6:
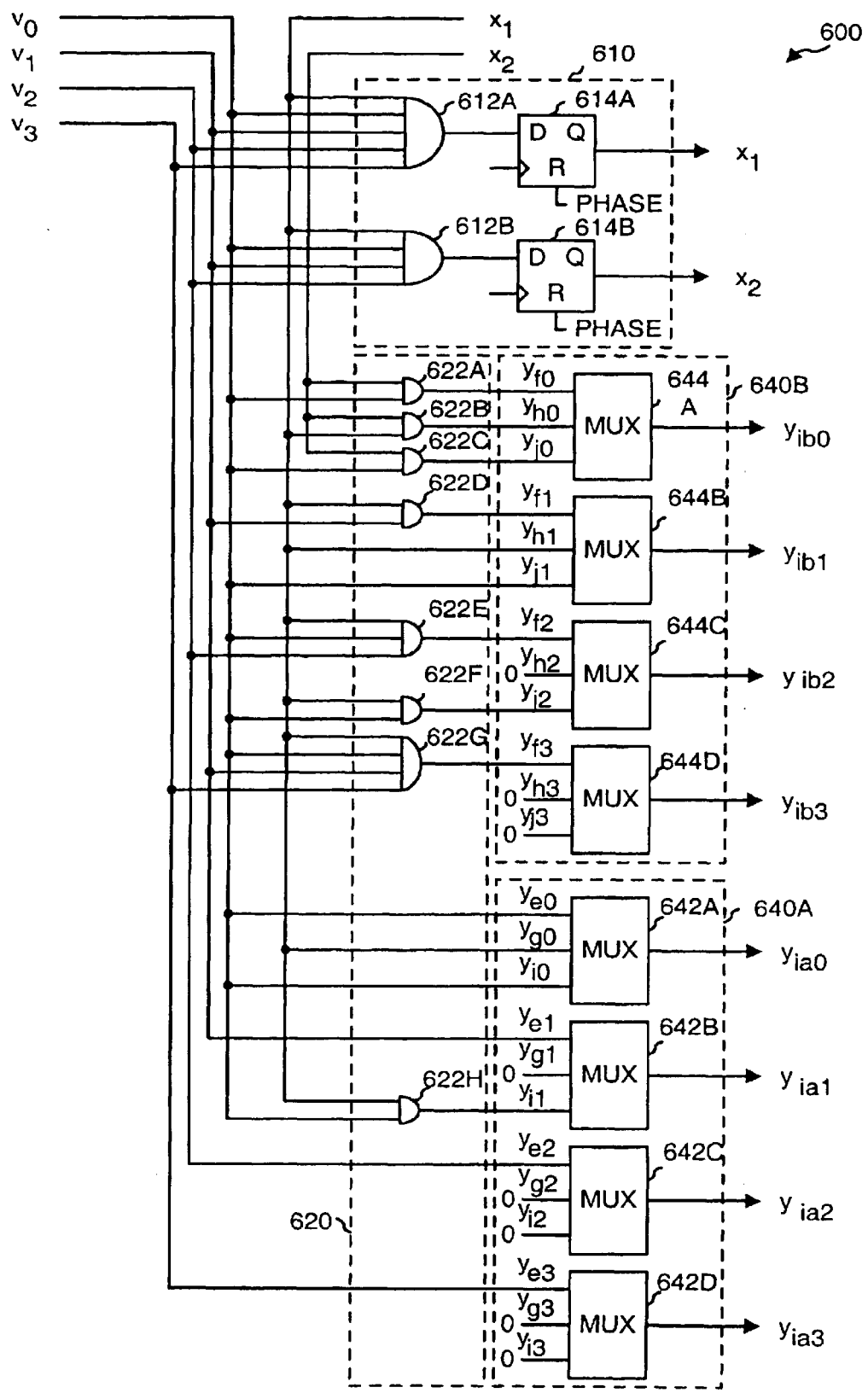
FIG. 6 is a schematic diagram of one embodiment of a convolutional encoder that implements another specific polynomial generator matrix and can code four code bits in parallel.

FIG. 6 is a schematic diagram of a specific embodiment of a convolutional encoder 600 that can code four input code bits in parallel and implements the polynomial generator matrix expressed in equation (2). Convolutional encoder 600 includes an encoder state machine 610 that implements the state machine defined by Table 4, an output generator 620 that generates the encoder outputs defined in Tables 4 through 6, and multiplexers 640A and 640B that provide the proper encoder outputs for the data and code-tail phases for packet formats 1 and 2.

As shown in FIG. 6, four input code bits, $v_0$ through $v_3$, are provided in parallel to the inputs of encoder state machine 610 and output generator 620, each of which also receives the current encoder state defined as $X_n=[x_2\ x_1]$. Each AND gate 612 within encoder state machine 610 selectively couples to the inputs $v_0$–$v_3$ and $x_1$–$x_2$, as defined by the last row in Table 4. For example, AND gate 612A couples to the inputs $x_1$, $v_0$, $v_1$, $v_2$, $v_3$, and $v_4$, as defined by the entry in the last row, third column ($x_1$) in Table 4. The outputs of AND gates 612A and 612B couple to the inputs of registers 614A and 614B, respectively. The outputs of registers 614A and 614B comprise the state machine outputs $x_1$ and $x_2$, respectively.

Similarly, each AND gate 622 within output generator 620 selectively couples to the inputs $v_0$–$v_3$ and $x_1$–$x_2$, as defined by the last two columns in Tables 4 through 6. For example, AND gate 622A couples to the inputs $x_2$ and $v_0$ and generates $y_{f0}$ (the second row, last column in Table 4), AND gate 622B couples to the inputs $x_2$ and $x_1$ and generates $y_{h0}$ (the second row, last column in Table 5), and AND gate 622C couples to the inputs $x_2$ and $v_0$ and generates $y_{j0}$ (the second row, last column in Table 6). The other encoder outputs are generated as indicated in Tables 4 through 6.

Multiplexer 640A includes 3×1 multiplexers 642A through 642D that provide the first encoder outputs $y_{ia0}$ through $y_{ia3}$, respectively, for inner convolutional encoder

600. During the data phases, $y_{e0}$ through $y_{e3}$ are provided through multiplexers 642A through 642D, respectively. During the code-tail phase, multiplexers 642A through 642D respectively provide $y_{g0}$ through $y_{g3}$ for packet format 1 and $y_{i0}$ through $y_{i3}$ for packet format 2. Similarly, multiplexer 640B includes 3×1 multiplexers 644A through 644D that provide the second encoder outputs $y_{ib0}$ through $y_{ib3}$, respectively, for inner convolutional encoder 600. During the data phases, $y_{f0}$ through $y_{f3}$ are provided through multiplexers 644A through 644D, respectively. During the code-tail phase, multiplexers 644A through 644D respectively provide $y_{h0}$ through $y_{h3}$ for packet format 1 and $y_{j0}$ through $y_{j3}$ for packet format 2.

Another aspect of the invention provides an interleaver capable of storing multiple code bits generated in parallel by the outer convolutional encoder and providing multiple code bits in parallel to the inner convolutional encoder. Referring back to FIG. 2, an interleaver is coupled between the outer and inner convolutional encoders. The interleaver is designed to store one or more packets of code bits. After an entire packet has been stored, the code bits are then retrieved in a read order that is different than the write order to achieve interleaving of the code bits. If no interleaving is desired, the code bits can be retrieved from the interleaver in the same order.

The outer convolutional encoder of the exemplary embodiment can be designed to receive and code M data bits in parallel and generate M•R code bits, where R is related to the code rate of the outer convolutional encoder (e.g., R=2 for a rate ½ encoder). To expedite processing and reduce delays, the interleaver can be designed to store M•R code bits from the outer convolutional encoder in parallel as the code bits are generated by the encoder. Similarly, the inner convolutional encoder can be designed to receive and code N code bits in parallel. Again, to expedite processing and reduce delays, the interleaver can be designed to provide at least N code bits in parallel to the inner convolutional encoder on a single read operation.

The code bits from each of the outer and inner convolutional encoders may be punctured to provide code bits at other code rates. For example, referring back to Table 1, the outputs from the outer convolutional encoder is unpunctured for packet format 1 to obtain a code rate of ½ and punctured for packet format 2 to obtain a code rate of ⅔. Similarly, the outputs from the inner convolutional encoder is unpunctured for packet format 1 to obtain a code rate of ½ and punctured for packet format 2 to obtain a code rate of ¾. The interface between the encoder and the interleaver can be designed to efficiently achieve the symbol puncturing.

Figure 7A:
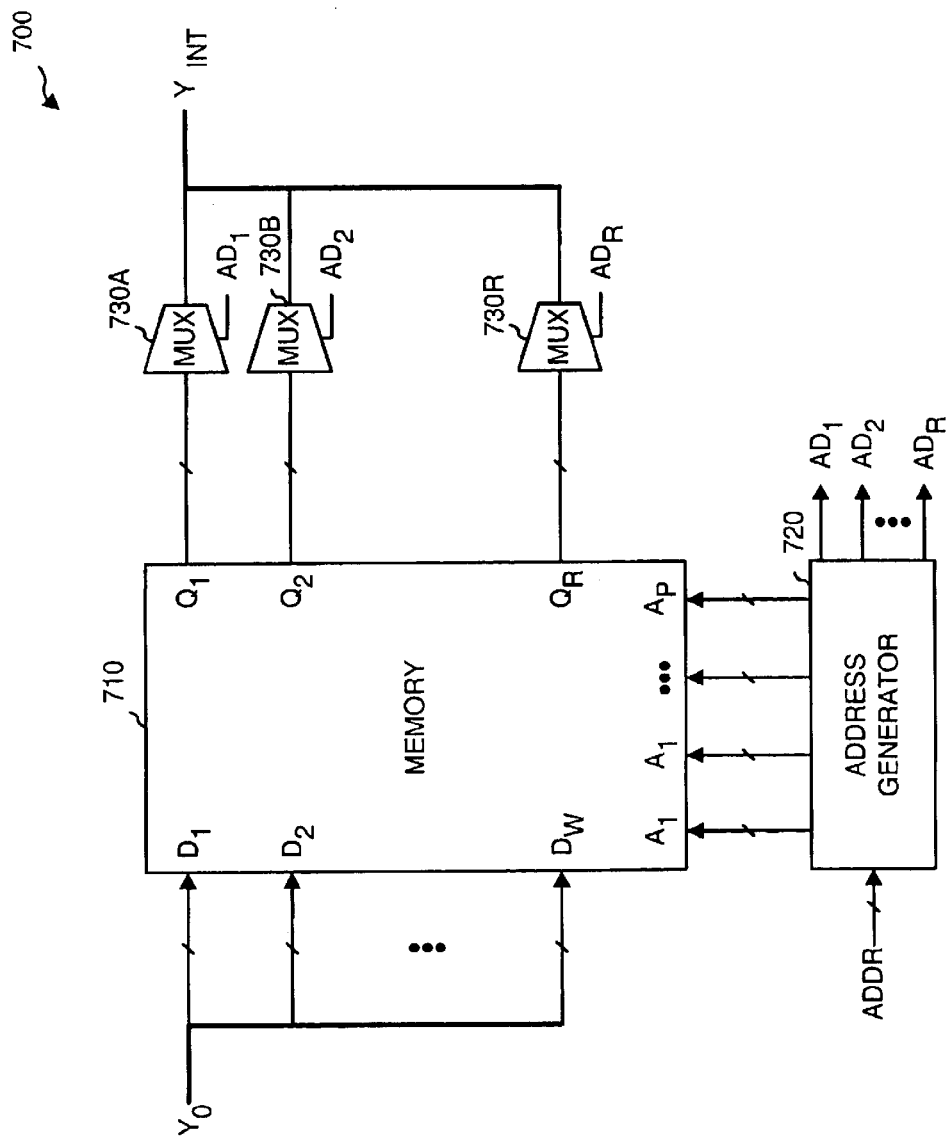
FIG. 7A is a diagram of an interleaver.

FIG. 7A is a diagram of an embodiment of an interleaver 700. In this embodiment, interleaver 700 is implemented with a multi-port memory 710 having P ports, where P is greater than one. Depending on the particular memory unit used to implement the interleaver, each of the P ports may be used as both write and read port or may be a dedicated write or read port. In the embodiment shown in FIG. 7A, memory 710 includes W ports designated as write ports $D_1$ through $D_W$, and R ports designated as read ports $Q_1$ through $Q_R$. Memory 710 further includes P address inputs, $A_1$ through $A_P$, one address input for each of the P ports. Each write and read port can transfer C bits in parallel.

An address generator 720 receives an input address ADDR, generates the necessary addresses for each active port, and provides the generated addresses to the address inputs $A_1$ through $A_P$ of memory 710. Although not shown in FIG. 7A for simplicity, address generator 720 further generates one or more control signals that direct memory 710 to perform a write or read operation.

In an embodiment, memory 710 is configured as a two-dimensional memory having a number of rows and a number of columns. In an embodiment, code bits are written to sequential rows in memory 710. For efficiency, the width of each row can correspond to the width of each port (i.e., C bits). This allows up to W rows of code bits to be written to the W write ports of memory 710 for each write operation. Once the code bits for an entire packet have been stored to memory 710 the code bits can be retrieved from the memory. In an embodiment, code bits are also read from memory 710 by rows. For the embodiment shown in FIG. 7A, up to R rows of code bits can be retrieved from the R read ports for each read operation.

Various designs can be used to provide code bits from interleaver 700 to the inner convolutional encoder. The particular design to implement is dependent on the particular system requirements. In one design, R multiplexers 730A through 730R are coupled to the R read ports $Q_1$ through $Q_R$, respectively. For each read operation, up to R rows of code bits are retrieved from memory 710 and provided to multiplexers 730A through 730R, which also receive the control signals $AD_1$ through $AD_R$, respectively. Each multiplexer 730 receives the C code bits, selects one of the code bits based on the respective control signal $AD_X$, and provides the selected code bit to the multiplexer output. The control signals $AD_1$ through $AD_R$ select a particular code bit from each retrieved row of code bits. R multiplexers 730 can thus be used to provide up to R code bits in parallel to the inner convolutional encoder.

For a clearer understanding, a specific design of the interleaver is now described for used with the outer and inner convolutional encoders described above in FIGS. 5A, 5B, and 6. In the above encoder designs, the outer convolutional encoder receives and codes 8 data bits in parallel in one clock cycle to generate 16 code bits, and the inner convolutional encoder receives and codes 4 code bits in parallel. In this specific interleaver design, an 8-port memory is employed, with four ports being used for receiving code bits in write operations and four ports being used for providing code bits in read operations. In this design, each port is capable of receiving or providing 8 bits in parallel. Thus, for this specific design, up to 32 code bits can be written to the interleaver in a write operation, and up to 32 code bits can be read from the interleaver in a read operation.

FIG. 7B is a diagram of an embodiment of the interface between the outer convolutional encoder and the interleaver with no puncturing. In this embodiment, the code bits generated by the outer convolutional encoder are provided to four registers 732A through 732D. Registers 732A and 732B receive the 16 code bits generated in the first clock cycle and registers 732C and 732D receive the 16 code bits generated in the second (e.g., alternate) clock cycle. When no puncturing is performed, all 32-code bits on registers 732A through 732D are provided to ports $D_1$ through $D_4$, respectively, of the memory in one write operation.

FIG. 7C is a diagram of an embodiment of the interface between the outer convolutional encoder and the interleaver with puncturing. Referring back to Table 1, the code bits for the outer code are punctured with the puncturing pattern (1011) for packet format 2. Thus, in one clock cycle, 16 code bits are generated, 4 code bits are punctured, and 12 code bits are stored. Initially, the 16 code bits generated in the first clock cycle are stored to registers 732A and 732B, and the 16 code bits generated in the second clock cycle are stored to registers 732C and 732D. After the puncturing, 24 code bits remain, as shown in FIG. 7C, and are provided to three write ports (e.g., $D_1$ through $D_3$).

The address generator provides the proper addresses for writing the unpunctured code bits to sequential rows in the memory. One address is generated for each active port used for writing the code bits. Thus, the address generator generates four addresses for port $D_1$ through $D_4$ when no puncturing is performed and generates three addresses for port $D_1$ through $D_3$ when puncturing is performed.

To provide four code bits in parallel to the inner convolutional encoder, four rows of code bits are retrieved from the memory and provided to four 8×1 multiplexers. Each multiplexer also receives a respective 3-bit control signal $AD_X$ that selects a particular bit in the retrieved row to provide to the inner convolutional encoder. The address for each retrieved bit may thus be partitioned into two parts, with the first part identifying a particular row in the memory and the second part identifying a particular location within the row. The first part of the address is provided to the appropriate address input of the memory and the second part is provided as the control signal $AD_X$. The first and second parts of the address are generated in accordance with the particular interleaving scheme defined by the system or standard being implemented.

The interleaver of the exemplary embodiment can also be implemented using other memories. For example, a single-port memory unit or multiple memory units can be used to concurrently store and provide multiple bits in parallel. For a single-port memory unit, multiple write operations may be used to store the generated code bits, and multiple read operations may also be used to retrieve the required code bits. In designs employing multiple memory units, each memory unit may be operated similar to a port (or a pair of ports) of the multi-port memory. Thus, numerous designs can be used to implement the interleaver and are within the scope of the present invention.

In the embodiments described above, an interleaver is used between the outer and inner convolutional encoders. This configuration is used to implement a Turbo encoder, which can provide certain advantages. In other encoder designs, interleaving after the outer convolutional encoder may not be necessary, and a memory may not be needed after the outer convolutional encoder or may simply be used as a buffer.

The concatenated encoder of the exemplary embodiment can be operated in various manners. In one specific design, the encoder is operated to code one packet of data at a time. Referring back to FIG. 2, a particular packet of data can be coded by the outer convolutional encoder and stored to the interleaver. After an entire packet has been coded by the outer convolutional encoder, the code bits are retrieved from the interleaver and coded by the inner convolutional encoder. Once the entire packet has been coded by the inner convolutional encoder, the next packet is coded by the outer convolutional encoder. This design reduces the memory requirement for the interleaver, which may be desirable in some applications.

In another specific design, the interleaver is implemented with the capacity to store two or more packets of code bits. For example, the memory used to implement the interleaver can be partitioned into two banks, with each memory bank being capable of storing an entire packet of code bits. The two memory banks allow the outer and inner convolutional encoders to operate on two packets concurrently. The outer convolutional encoder codes a first packet and stores the code bits for this packet to one memory bank. After the entire first packet has been stored to memory, the outer convolutional encoder codes a second packet and stores the code bits for this packet to the second memory bank. While the outer convolutional encoder codes and stores the code bits for the current packet to one memory bank, the inner convolutional encoder can retrieve and code the code bits for the previous packet from the other memory bank. This design can reduce the processing delays.

Figure 8:
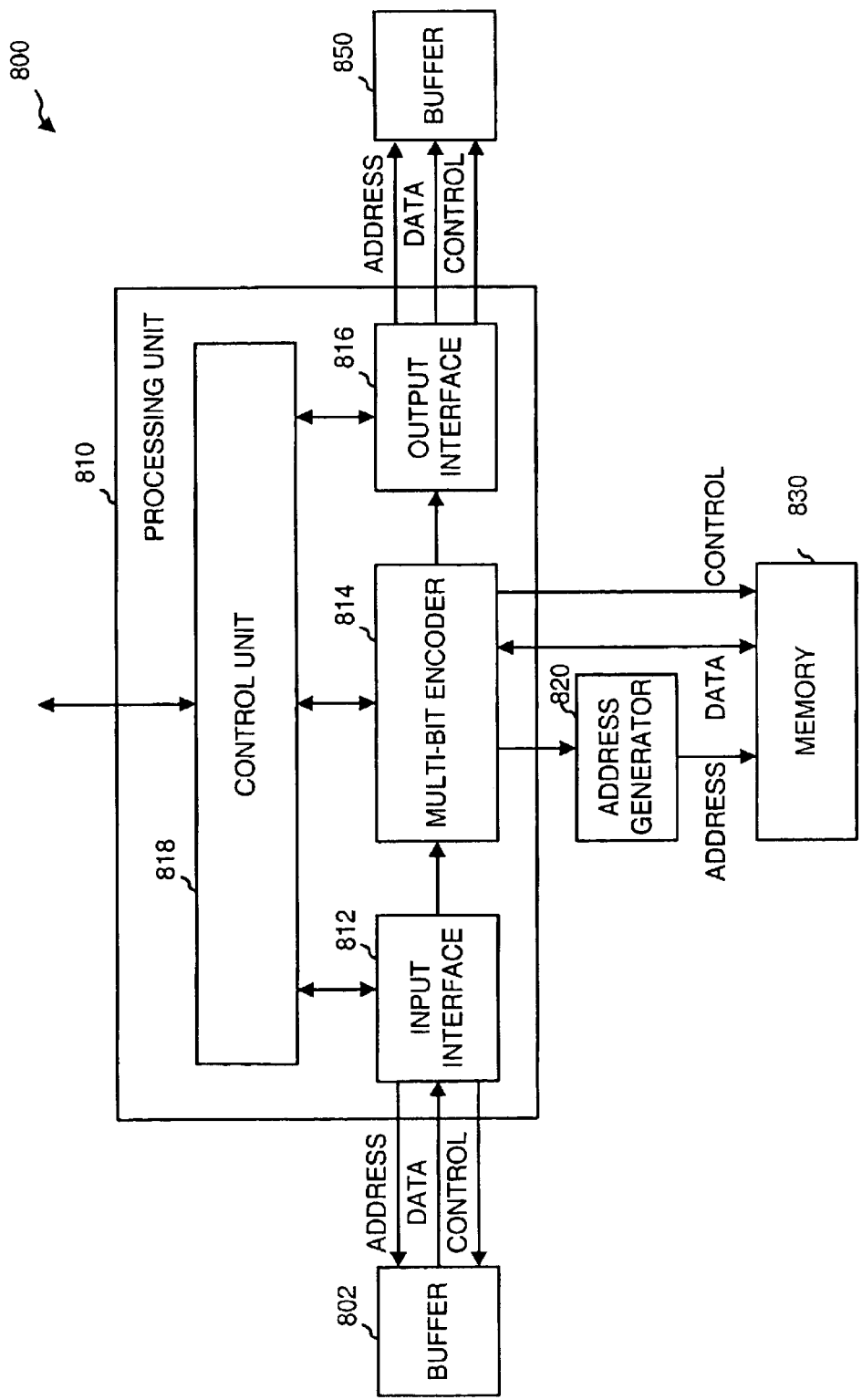
FIG. 8 is a block diagram of an encoder according to one embodiment.

FIG. 8 is a block diagram of a specific design of an encoder 800 that can be used to implement some embodiments. Encoder 800 may be used to implement encoder 114 in FIG. 1. Encoder 800 includes a processing unit 810 coupled to an address generator 820 and a memory 830. Processing unit 810 receives data from a buffer 802 and control information from a control source (not shown), codes the received data in accordance with the control information, and provides the coded data to a buffer 850.

In the embodiment shown in FIG. 8, processing unit 810 includes an input interface 812, a multi-bit encoder 814, an output interface 816, and a control unit 818. Input interface 812 generates addresses and control signals for buffer 802, receives data provided by buffer 802 in response to the generated addresses and control signals, and routes the received data to multi-bit encoder 814. Multi-bit encoder 814 implements the output and inner convolutional encoders and may be implemented with one or more look-up tables or one or more encoders such as the one described above in FIG. 4. When operated as an outer convolutional encoder, multi-bit encoder 814 codes the data from input interface 812 and provides the generated code bits to memory 830. And when operated as an inner convolutional encoder, multi-bit encoder 814 codes the code bits from memory 830 and provides the generated code bits to output interface 816. Output interface 816 then provides the coded data to buffer 850.

Control unit 818 receives various control information such as, for example, the particular data packet to code, the location of the packet in buffer 802, the packet format, the coding scheme to use, the location to store the coded packet in buffer 850, and so on. Control unit 818 then directs input interface 812 to retrieve the appropriate data bits from buffer 802, directs encoder state machine 814 to use the appropriate coding scheme, and further directs output interface 816 to provide the coded data to the appropriate location in buffer 850.

Address generator 820 generates the appropriate addresses for both writing code bits to memory 830 and reading code bits from the memory. Address generator 820 can be implemented with logic, a look-up table, or some other designs.

Memory 830 stores the code bits generated by multi-bit encoder 814 and also provides the stored code bits to multi-bit encoder 814. By properly generating the addresses, memory 830 can be operated to provide interleaving of the code bits. Memory 830 can be implemented with a multi-port memory, as described above, or with one or more memory units.

Figure 9:
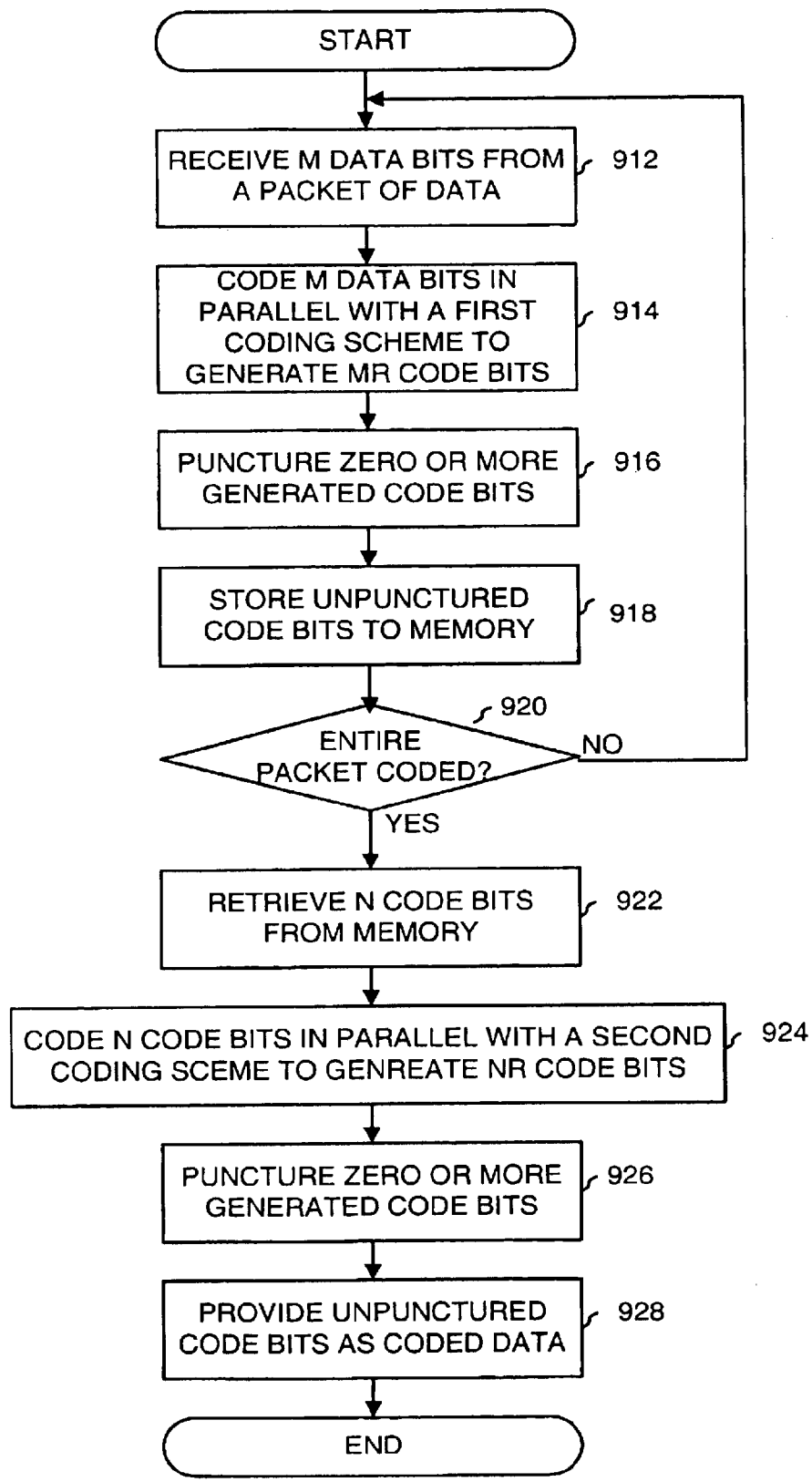
FIG. 9 is a flow diagram of a method for performing concatenated coding of multiple data bits in parallel according to one embodiment.

FIG. 9 is a flow diagram of an embodiment of a method for performing concatenated coding of multiple data bits in parallel. Initially, a number of (M) data bits from a particular data packet is received, at step 912, and coded in parallel in accordance with a first (e.g., convolutional) coding scheme to generate a number of (MR) code bits, at step 914. The number of code bits generated by the first coding scheme is dependent on the particular code rate of the scheme. Zero of more of the generated code bits may be punctured with a first puncturing scheme, at step 916, to provide code bits at a different code rate. The unpunctured code bits are then stored to a memory, at step 918.

In the embodiment shown in FIG. 9, an entire packet is coded by the first coding scheme and stored before subsequent coding by a second coding scheme. This allows for interleaving of the code bits, as described above. Thus, a determination is made whether the entire packet has been coded, at step 920. If the answer is no, the process returns to step 912 and another M (or less) data bits are received.

Otherwise, if the entire packet has been coded, a number of (N) code bits is retrieved from the memory, at step 922, and coded in parallel in accordance with the second (e.g., convolutional) coding scheme to generate a number of (NR) code bits, at step 924. Again, the number of code bits generated by the second coding scheme is dependent on the particular code rate of the scheme. And again, zero of more of the generated code bits may be punctured with a second puncturing scheme, at step 926, to provide code bits at another code rate. The unpunctured code bits are then provided as coded data to the next processing unit (e.g., modulator 116 in FIG. 1), at step 928.

For efficiency and reduced delays, W words may be stored in parallel (e.g., via W write ports) to the memory, and R words may be retrieved in parallel (e.g., via R read ports) from the memory. The W words allow for parallel storage of the unpunctured code bits from the first coding scheme and the R words allow for N code bits to be provided in parallel to the second coding scheme. The memory may be operated in the manner described above to achieve interleaving of the code bits. For example, W words may be written to sequential rows in the memory and R words may be read from permutated rows in the memory.

The encoder and interleaver of the exemplary embodiment can be used to greatly shorten the coding time. By coding M data bits in parallel with the outer convolutional encoder and N code bits in parallel with the inner convolutional encoder, the overall coding delays can be significantly reduced. The interleaver of the invention supports parallel coding with its ability to receive multiple code bits for a write operation and to provide multiple code bits for a read operation. The improvement in the processing delays for a specific design, with M=8 and N=4 and for packet formats 1 and 2 in the HDR system, is shown in Table 7.

TABLE 8

| | Packet format 1 | | Packet format 2 | |
| --- | --- | --- | --- | --- |
| | parallel | serial | parallel | serial |
| Outer convolutional encoder | | | | |
| Input bits | 1018 | | 2042 | |
| Code-tail bits | 4 | | 4 | |
| Total input bits | 1022 | | 2046 | |
| Clock cycles needed | 128 | 1024 | 256 | 2048 |
| Inner convolutional encoder | | | | |
| Input bits | 2044 | | 3069 | |
| Code-tail bits | 4 | | 3 | |
| Total input bits | 2048 | | 3072 | |
| Clock cycles needed | 512 | 2048 | 768 | 3072 |
| Coding time (20 MHz clock) | | | | |
| Outer encoder ($\mu$sec) | 6.4 | 51.2 | 12.8 | 102.4 |
| Inner encoder ($\mu$sec) | 25.6 | 102.4 | 38.4 | 153.6 |
| Total coding time ($\mu$sec) | 32.0 | 153.6 | 51.2 | 256.0 |

For the specific design shown in Table 8, the overall coding delays are reduced by a factor of 4.8 for delays provided by the encoder and interleaver of the present invention provide numerous advantages. Some of these advantages are briefly described below.

First, shorter processing delays may be used to support certain types of services, such as voice and video, which have more stringent delays requirements. The shorter processing delays may thus allow for use of more efficient coding schemes for delay sensitive applications.

Second, shorter processing delays can improve system performance. For example, if a particular user or data rate is selected for a particular transmission based on the conditions of the communications link, which are determined at a particular time, shorter processing delays increase the likelihood that the link conditions have not changed by the time of the data transmission. Link conditions typically vary over time, and longer processing delays increase the likelihood that the link conditions have changed by the time of the data transmission, which can then result in degraded performance.

Third, shorter processing delays can improve the capacity of some communications systems. For example, in the HDR system, power control data is multiplexed with the traffic data and transmitted to the user terminals. Shorter processing delays allow for more accurate control of the transmit power of the user terminals, which can increase the system capacity and improve performance.

Fourth, shorter processing delays allow sequential sharing of a hardware resource (i.e., the encoder) in one processing time slot (i.e., the forward link slot in an HDR system) by multiple transmitting entities (i.e., three users in a three sector system) to reduce the overall area of the hardware design.

For clarity, certain aspects and embodiments of the encoder of the invention have been described specifically for the forward link in the HDR system. However, the invention can also be used in other communications systems that employ the same, similar, or different coding schemes. For example, the encoder of the invention can be used to implement a convolutional encoder capable of receiving and coding multiple data bits in parallel. The encoder of the invention can also be used to implement a concatenated encoder, such as a Turbo encoder, that is capable of receiving and coding multiple data bits in parallel. The specific design of the encoder is dependent on various factors such as, for example, the particular polynomial generator matrix being implemented, the number of bits to code in parallel, the packet format, the use of code-tail bits, and so on.

The encoder of the invention can be advantageously used in a base station or a user terminal (e.g., a mobile unit, a telephone, and so on) of a communications system. The coding for the forward link (i.e., downlink) and reverse link (i.e., uplink) may be different, and is typically dependent on the particular CDMA system or standard being implemented. Thus, the encoder of the invention is typically designed specially for the particular application for which it is used.

Referring to the specific design shown in Tables 2 and 3, the next states and outputs for the outer convolutional encoder can be generated with functions having up to seven terms. Referring to the specific design shown in Tables 4 through 6, the next states and outputs for the inner convolutional encoder can be generated with functions having up to five terms. These functions can be easily generated using logic gates in a manner known in the art. The other elements of the outer and inner convolutional encoders (e.g., registers, multiplexers) can also be implemented in a manner known in the art.

Some or all of the elements described above for the encoder of the present invention (e.g., multi-bit encoder, input and output interfaces, control unit, encoder state machine, output generator, multiplexer, and so on) can be implemented within one or more Application Specific Integrated Circuits (ASICs), Digital Signal Processors (DSPs), Programmable Logic Device (PLD), Complex PLD (CPLD), controllers, micro-controllers, microprocessors, other electronic units designed to perform the functions described herein, or a combination thereof. Some or all of the elements of the encoder of the invention can also be implemented using software or firmware executed on a processor.

The memories and memory units such as the ones used to implement the interleaver of the present invention can be implemented with various memory technologies such as, for example, Random Access Memory (RAM), Dynamic RAM (DRAM), Flash memory, and others. The memory unit can also be implemented with storage elements such as, for example, a hard disk, a CD-ROM drive, and others. Various other implementation of the memory units are possible and within the scope of the present invention.

Recursive Coding of Multiple Bits in Parallel

According to an alternate embodiment, encoders are configured in parallel to provide twice the amount of output data, wherein multiple bits are processed by the encoder. The increase in data output is particularly applicable to a high data rate communication system wherein frames are to be encoded quickly. The exemplary embodiment encodes multiple bits per clock cycle, thus meeting the time constraints of a data transmission. This embodiment avoids the use of one encoder per sector by sharing a single encoder over multiple sectors. Alternate embodiments may implement any number of encoders in parallel. By sharing the encoding section across sectors, the speed of the individual encoder may be less strict.

According to one aspect of the exemplary embodiment frame buffer memories store multiple copies of each frame. A parallel Look Up Table (LUT) and multiplier circuits are used to implement the turbo interleaver address generators. The design uses AND-XOR trees to implement parallel encoding. The bit puncturing/reordering is also done in parallel subsequent to the encoding process.

Figure 10:
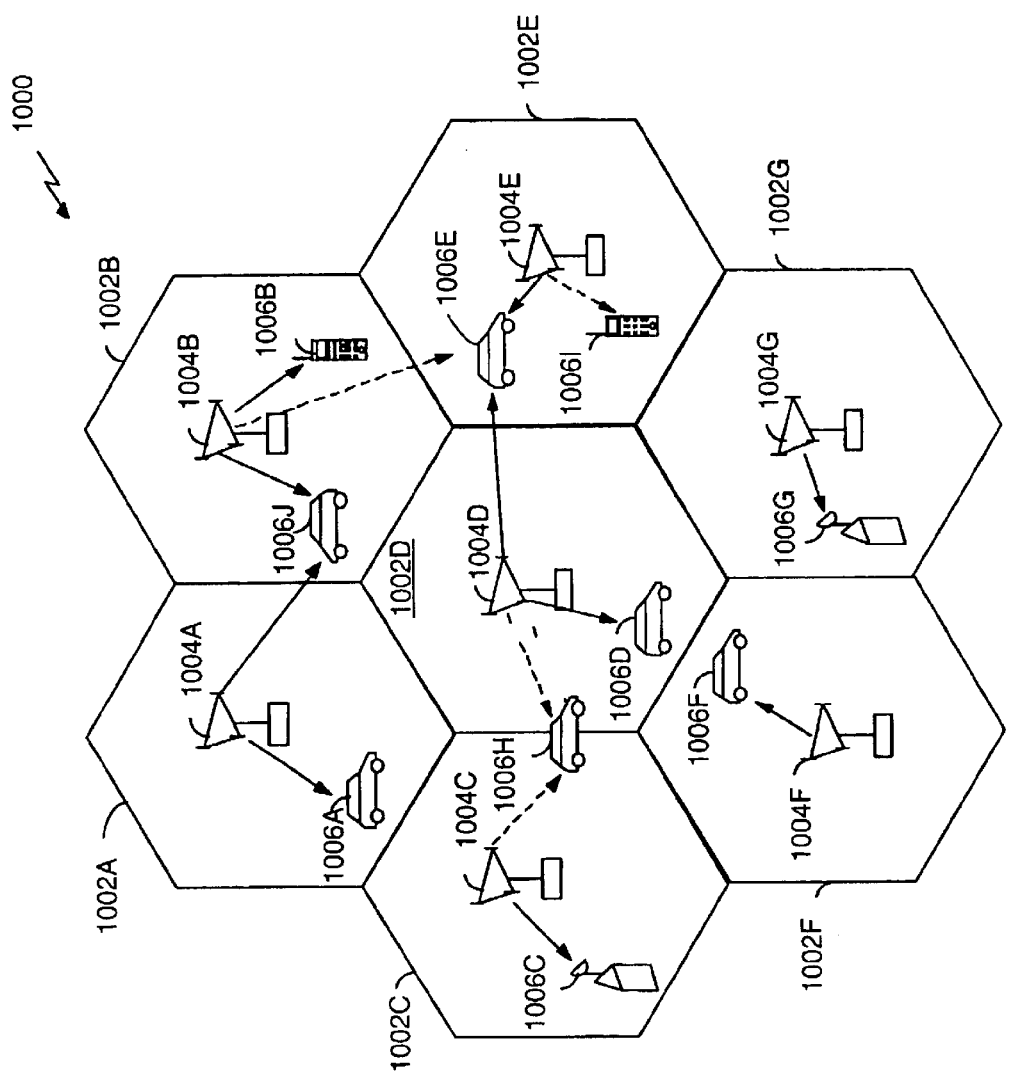
FIG. 10 is a wireless communication system.

FIG. 10 serves as an example of a communications system 1000 that supports a number of users and is capable of implementing at least some aspects and embodiments of the invention. Any of a variety of algorithms and methods may be used to schedule transmissions in system 1000. System 1000 provides communication for a number of cells 1002A through 1002G, each of which is serviced by a corresponding base station 1004A through 1004G, respectively. In the exemplary embodiment, some of base stations 1004A to 1004G have multiple receive antennas and others have only one receive antenna. Similarly, some of base stations 1004A to 1004G have multiple transmit antennas, and others have single transmit antennas. There are no restrictions on the combinations of transmit antennas and receive antennas. Therefore, it is possible for a base station 1004 to have multiple transmit antennas and a single receive antenna, or to have multiple receive antennas and a single transmit antenna, or to have both single or multiple transmit and receive antennas.

Terminals 1006 in the coverage area may be fixed (i.e., stationary) or mobile. As shown in FIG. 1, various terminals 1006 are dispersed throughout the system. Each terminal 1006 communicates with at least one and possibly more base stations 1004 on the downlink and uplink at any given moment depending on, for example, whether soft handoff is employed or whether the terminal is designed and operated to (concurrently or sequentially) receive multiple transmissions from multiple base stations. Soft handoff in CDMA communications systems is well known in the art and is described in detail in U.S. Pat. No. 5,101,501, entitled "Method and system for providing a Soft Handoff in a CDMA Cellular Telephone System," which is assigned to the assignee of the present invention.

The downlink refers to transmission from the base station to the terminal, and the uplink refers to transmission from the terminal to the base station. In the exemplary embodiment, some of terminals 1006 have multiple receive antennas and others have only one receive antenna. In FIG. 1, base station 1004A transmits data to terminals 1006A and 1006J on the downlink, base station 1004B transmits data to terminals 1006B and 1006J, base station 1004C transmits data to terminal 1006C, and so on.

According to an exemplary embodiment, a wireless communication system is adapted for encoding information for transmission using multiple convolutional encoders configured in parallel. Each of the individual encoders has a similar structure and are coupled via an interleaver. The parallel encoders provide a multiple number of outputs, i.e., for two encoders in parallel; the combination provides twice as many output values. A selection is then made at the output for those output values that will be used in further processing. Multiple bits are processed through the parallel encoders. Processing within each encoder is performed in parallel.

The exemplary embodiment processes multiple bits per system clock cycle, for example, four bits per cycle. The encoder of the exemplary embodiment is implemented using a combination of hardware and software. The hardware is used to store and process information input bits. The software includes instructions for controlling the hardware, and other encoding computations, e.g. generating the interim values during the encoding process.

Figure 11:
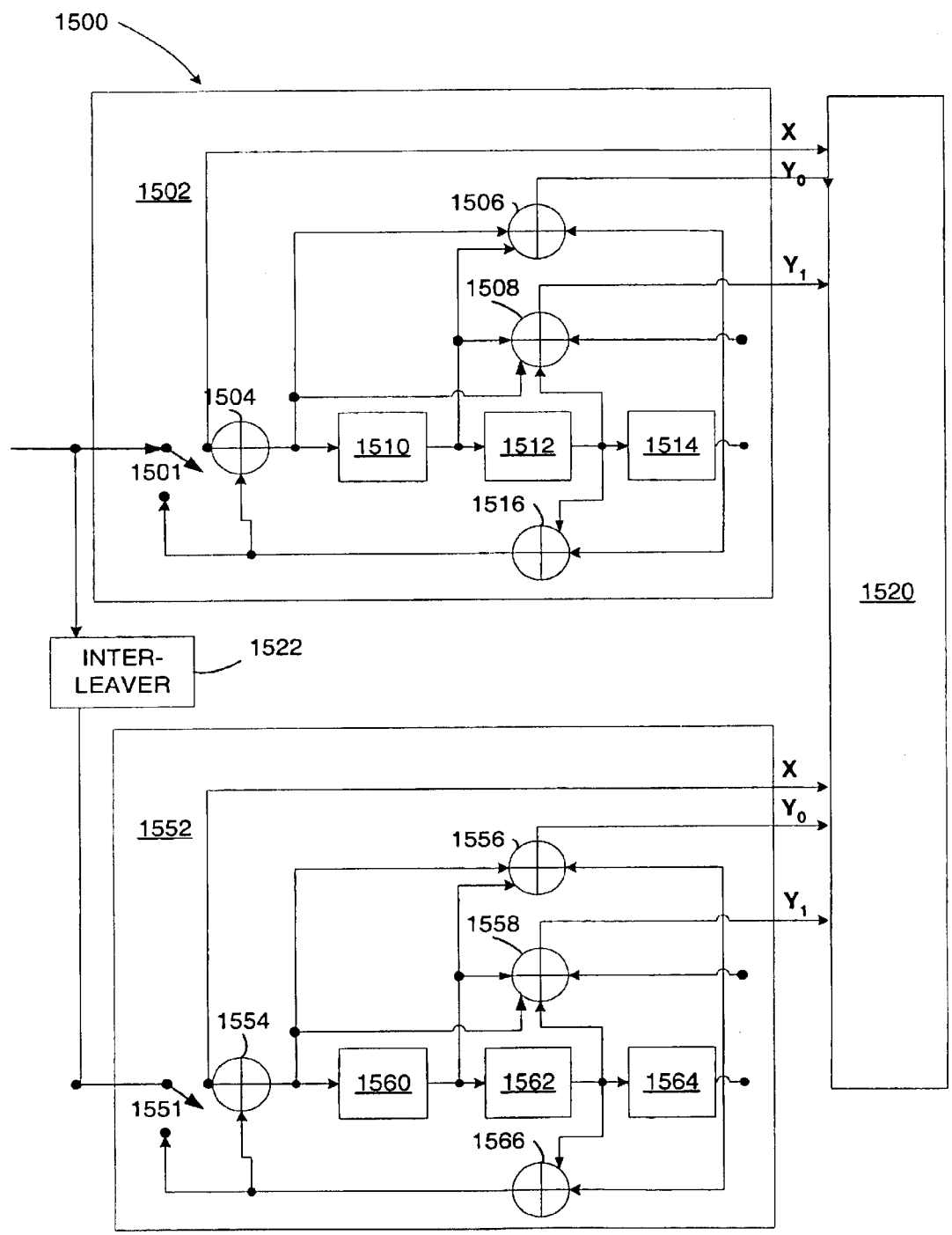
FIG. 11 is a parallel concatenated encoder according to one embodiment.

FIG. 11 illustrates a turbo encoder block 1500 according to one embodiment that encodes 4 bits per clock. The turbo encoder block 1500 illustrated in FIG. 11 employs two systematic, convolutional encoders 1502, 1552 connected in parallel, with an interleaver 1522 preceding the second convolutional encoder 1552. The interleaver 1522 is referred to as a turbo interleaver. The two convolutional codes are called the constituent codes of the turbo code. The outputs of the constituent encoders are punctured and repeated to achieve the desired number of turbo encoder output symbols. The transfer function of the constituent code according to one embodiment is given as:

$$G(D) = \begin{bmatrix} 1 & \frac{n_0(D)}{d(D)} & \frac{n_1(D)}{d(D)} \end{bmatrix} \quad \text{Eq (9)}$$

wherein:

$$d(D)=1+D^2+D^3 \quad \text{Eq (10)}$$

$$n_0(D)=1+D+D^3, \text{and} \quad \text{Eq (11)}$$

$$n_1(D)=1+D+D^2+D^3. \quad \text{Eq (12)}$$

Each of the constituent encoders 1502, 1552 includes a plurality of registers, specifically within encoder 1502 are registers 1510, 1512, and 1514, and within encoder 1552 are registers 1560, 1562, and 1564. Initially, the states of the registers within constituent encoders 1502, 1552 are set to zero. Each encoder 1502, 1552 is clocked via an input switch 1501, 1551, respectively. Information bits are provided as input to the first encoder 1502 via switch 1501. The input information bits include $N_{turbo}$ bits, which is effectively the number of bits into the encoder 1500. The input information bits are further provided to a turbo interleaver 1522, wherein the bits are interleaved, i.e., scrambled, to increase the accuracy of the transmission of data. The output of the turbo interleaver 1522 is provided to the second encoder 1552 via switch 1551. The operation of each of the encoders 1502 and 1552 is similar and therefore the following discussion only details the operation of encoder 1502. Alternate embodiments may implement different types of encoders for each encoder included in turbo encoder block 1500.

The input to the encoder 1502 is provided to a switch, wherein the switch is controlled by a system clock (not shown). The information bits are clocked once for each of the $N_{turbo}$ data bit periods with the switch up; then, clocked multiple times for each of the tail bit periods with the switch down. According to one embodiment, the information bits are clocked 6 times for the tail bit period, including 3 clocks for each encoder 1502, 1552. The encoded data output symbols are generated by clocking the constituent encoders 1502, 1552 $N_{turbo}$ times with the switches in the up positions and puncturing the outputs according to a predetermined puncturing pattern. The output for encoder 1500 is generated in the sequence: X, $Y_0$, $Y_1$, X', $Y'_0$, $Y'_1$. According to the exemplary embodiment, symbol repetition is not implemented in generation of the output symbol. The turbo encoder 1500 generates tail output symbols which are appended to the encoded data output symbols. The tail output symbols are generated after the constituent encoders 1502, 1552 have been clocked $N_{turbo}$ times.

Operation of the turbo interleaver 1522 is designed to produce a functional equivalent result as if each of the sequence of input bits was sequentially written to an array at a sequence of addresses, wherein the sequence is then read out from another sequences of addresses defined by a predetermined interleaving procedure or protocol. The interleaver operation is further detailed with respect to FIG. 12.

Continuing with FIG. 11, one node of the switch 1501 is coupled to the input. A second node of the switch 1501 is coupled to an exclusive OR (XOR) gate 1504. The output of XOR gate 1504 is coupled to a series of registers or delay elements 1510, 1512, 1514. Each delay element has an associated state, wherein, information stored in delay element 1510 is referred to as in "state 0;" information stored in delay element 1512 is referred to as in "state 1;" and information stored in delay element 1514 is referred to as in "state 2." The output of delay element 1510 is identified as "S0;" the output of delay element 1512 is identified as "S1;" an the output of delay element 1514 is identified as "S2."

The outputs of delay elements 1512 and 1514 are each coupled to inputs to an XOR gate 1516. The output of XOR gate 1516 is then coupled to a third node of the input switch 1501 and to an input of XOR gate 1504. The output of XOR gate 1504 is further coupled to an input to an XOR gate 1508. Other inputs to XOR 1508 are received from each of the individual outputs of delay elements 1510, 1512, and 1514. The output of XOR gate 1504 is still further coupled to an input to XOR gate 1506. Other inputs to XOR gate 1506 are received from the individual outputs of delay elements 1510 and 1514.

The output of the encoder 1502 includes an X component directly from the input switch 1501, a parity bit output $Y_0$ from XOR gate 1506, and a second parity bit output $Y_1$ component from the output of XOR gate 1508. The outputs X, $Y_0$, and $Y_1$ are each provided to a symbol puncturing and repetition unit 1520.

Functionally, the configuration of encoder 1520 implements the following equations:

$$X=I \qquad \text{Eq (13)}$$

$$Y_0=[I \oplus (S1 \oplus S2)] \oplus S0+S2 \qquad \text{Eq (14)}$$

$$Y_1=[I \oplus (S1 \oplus S2)] \oplus S0 \oplus S1 \oplus S2 \qquad \text{Eq (15)}$$

wherein I represents the input information bits, S0, S1, and S2 represent the outputs of delay elements 1510, 1512, and 1514, respectively, and the operation $\oplus$ represents the logical XOR operation. By applying the associative and distributive rules of digital logic, the Equations (10) and (11) may be reduced to:

$$Y_0=I \oplus S1 \oplus S0 \qquad \text{Eq (16)}$$

$$Y_1=I \oplus S0. \qquad \text{Eq (17)}$$

According to the exemplary embodiment, the turbo encoder has two stages. During the first stage, the frame is read in from an external source. The Cyclic Redundancy Check (CRC) is also calculated during the first stage. During the second stage the frame is encoded, punctured and repeated. The code rate for the turbo encoder may be ⅓ or ⅕.

During the second stage, four bits are received at the encoder 1500, wherein the four bits are processed in parallel, so as to increase the throughput of the encoder. Effectively, although the input information bits I[0]:I[3] are presented concurrently to encoder 1500, the input information bits are processed as if presented to the encoder 1500 serially. This is accomplished by recursively applying the Equations (16) and (17) to the input data. During an individual system clock cycle, the values of the states are determined, i.e., S0[0]:S0[4], S1[0]:S1[4], S2[0]:S2[4], respectively.

Figure 12:
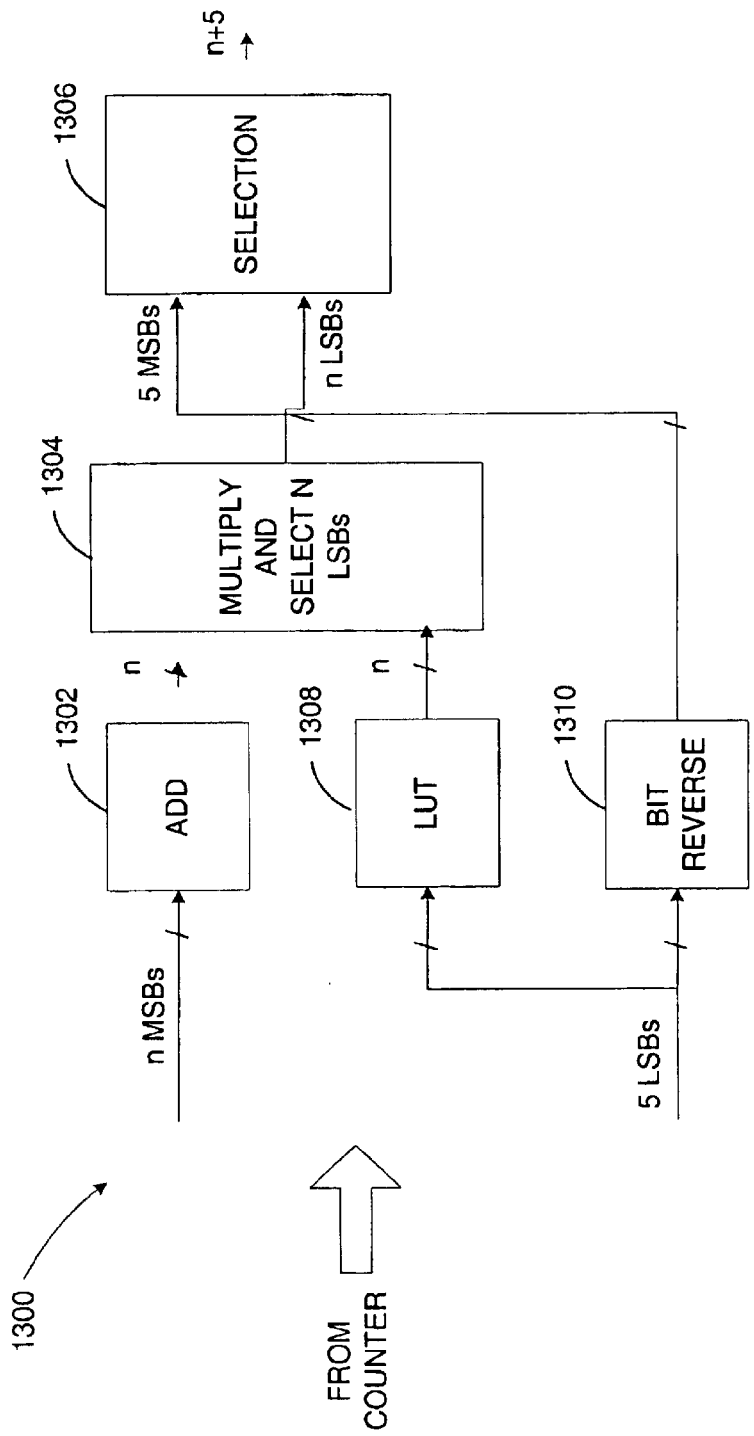
FIG. 12 is a functional diagram of a parallel concatenated encoder according to one embodiment.

FIG. 12 illustrates operation of an interleaver according to one embodiment. As illustrated, an interleaver 1300 receives an input from a counter (not shown) to increment the ADD circuitry 1302. Functionally, the address generation is equivalent to writing counter values into an array of memory storage rows. The rows are shuffled according to a bit-reversal or other rule, and the elements in each row are permuted according to a row-specific linear congruential sequence. The output addresses are then read out by columns. The linear congruential sequence may be given as:

$$x(i+1)=(x(i)+c)\bmod 2^n, \qquad \text{Eq (18)}$$

wherein x(0)=c and c is a row-specific value from a look-up table.

Continuing with FIG. 12, Most Significant Bit (MSB) information from the value of the counter is provided to the ADD circuitry 1302. The ADD circuitry 1302 increments the MSB value of the counter and provides the result to multiply unit 1304. In one embodiment, the resultant value is modified so as to provide only a predetermined number of bits as output. The Least Significant Bit (LSB) information from the value of the counter is provided to Lookup Table (LUT) 1308 and bit reverse unit 1310. The LSB information is used to address the LUT 1308, wherein the value stored in that location is also provided to the multiply unit 1304. The inputs to multiply unit 1304 are multiplied together and the product provided to selection unit 1306. In one embodiment, the multiply unit 1304 provides only a portion of the product as output to selection unit 1306, such as the LSB portion of the product. The bit reverse unit 1310 performs a bit reverse operation, similar to that discussed hereinabove, on the LSB portion of the counter value. The output of the bit reverse unit 1310 is provided to the selection unit 1306. According to the exemplary embodiment, the input to the selection unit 1306 received from the multiply unit 1304 is used as an LSB portion, and the input received from the bit reverse unit 1310 is used as an MSB portion. The selection unit 1306 also determines if the resultant output address is a valid address. If the address is not valid, the selection unit discards the result, wherein on the next counter increment, a new address is generated. Alternate embodiments may implement alternate interleaving schemes applied between the parallel convolutional encoders.

Figure 13:
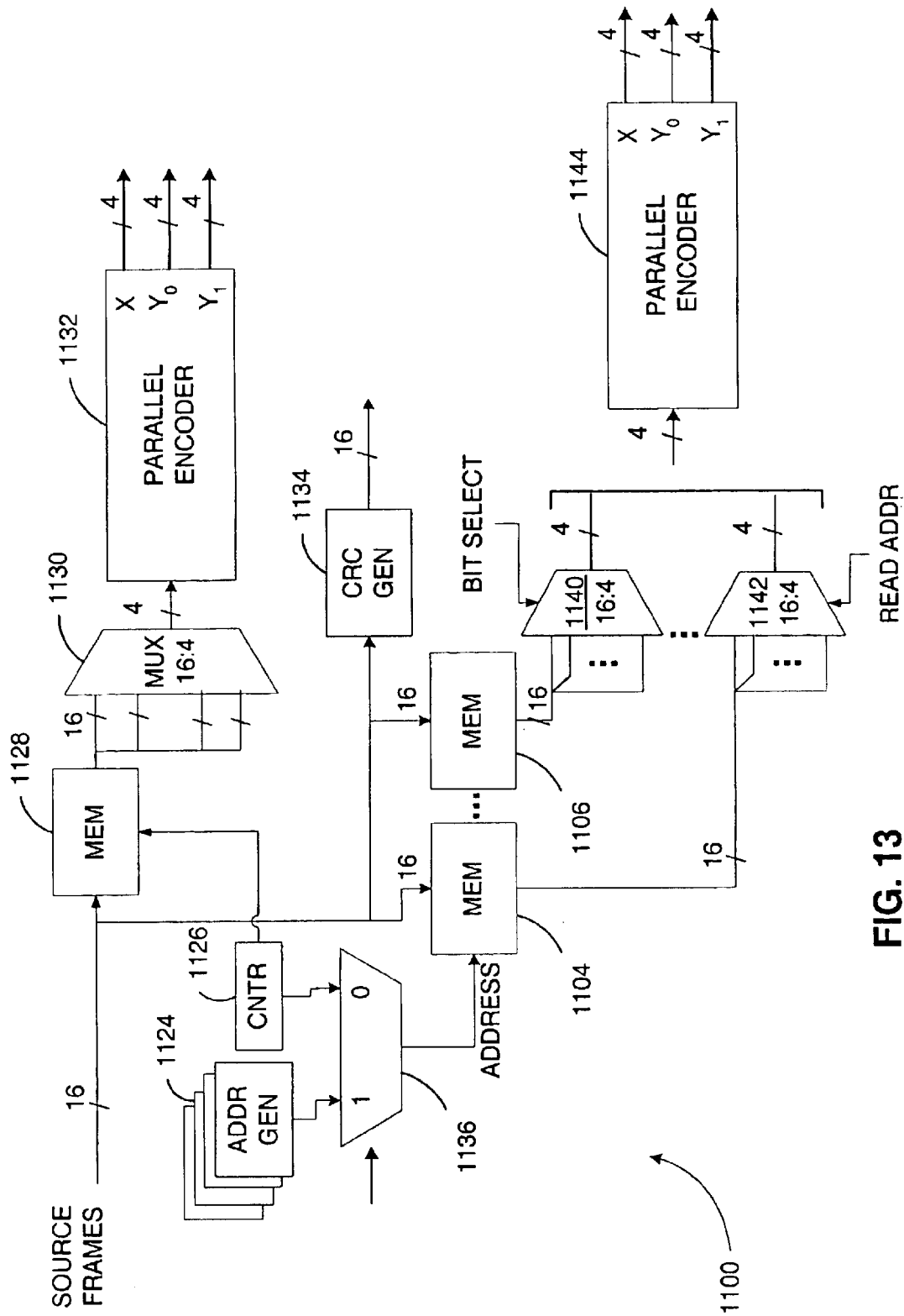
FIG. 13 is a functional diagram of a turbo encoder according to one embodiment.

Note that the encoder 1500 of FIG. 11 may be shared by multiple modulator blocks within a wireless transceiver and therefore, the encoder of the exemplary embodiment encodes multiple bits per clock cycle thus satisfying the speed requirements of a high speed data transmission system. For example, as illustrated in FIG. 13, the functional operation of encoder 1100 encodes four bits per clock cycle, wherein the encoder 1100 is designed to encode a maximum size frame in approximately 32 μs using a 40 MHz clock. As discussed hereinabove, the encoder 1100 operates in two stages. During the first stage, a frame is read out from an external source and the CRC is calculated. During the second stage, the frame is encoded, punctured, and repeated. As used in the description of the exemplary embodiment, a frame is a data transmission unit having an overhead portion and a payload portion.

FIG. 13 is a functional illustration of operation of encoder 1100 according to the exemplary embodiment. The encoder 1100 receives information bits as 16 bit words from an external source which according to one embodiment is a plurality of Random Access Memories (RAMs). Five identical copies are stored in memories within the encoder 1100. The bits are then selectively provided to a parallel encoder 1132 via a demultiplexer 1130. According to the exemplary embodiment, 16 bits are provided from the memory 1128 to the demultiplexer 1130, which selects 4 bits at a time for presentation to the parallel encoder 1132. The parallel encoder receives the 4 input bits and generates three outputs, X, $Y_0$, and $Y_1$. Each of the outputs is a 4 bit output, wherein the parallel encoder uses recursive processing to produce 4 bit outputs for each clock cycle.

As discussed hereinabove, the CRC generator 1134 operates during the first state, wherein a 16 bit CRC is computed on the packet currently being processed. A packet includes a payload, a CRC portion and a tail portion. One embodiment supports variable length packets. As the data is read at 16 bits per clock cycle, the CRC generator 1134 computes the CRC every cycle. By the end of the first stage, the CRC is ready. At this point, the CRC is written into the Memory Storage Unit (MEM) 1128 and also into four memory storage devices MEM, 1104 to 1106. Also during the first stage, the information bits are provided to the MEMs 1104 to 1106. The information bits are clocked to the MEMs 1104 to 1106, wherein 16 bits are clocked each clock cycle. Note that in the exemplary embodiment MEMs 1104 to 1106 include four memories, however, alternate embodiments may include alternate numbers of memories. The MEMs 1104 to 1106 receive addressing control information from address generator 1124 and counter 1126, which are each coupled to inputs to a multiplexor 1136. The output of the multiplexer 1136 provides the control signal to the MEMs 1104 to 1106. The address generator 1124 increments the addressing for storage of four values. During a write operation to the MEMs 1104 to 1106, each of the MEMs 1104 to 1106 receives the same address. During a read operation from the MEMs 1104 to 1106, each of the MEMs 1104 to 1106 receives a different address. As illustrated in FIG. 13, the MEM 1128 feeds one of the parallel encoders 1132, while the MEMs 1104 to 1106 feed a second parallel encoder 1144. From the parallel encoders 1132 and 1144, each of which provide output sets of X, $Y_0$, and $Y_1$, the output bits are provided to a symbol repetition and puncturing block, such as block 1520 as in FIG. 11.

Figure 14:
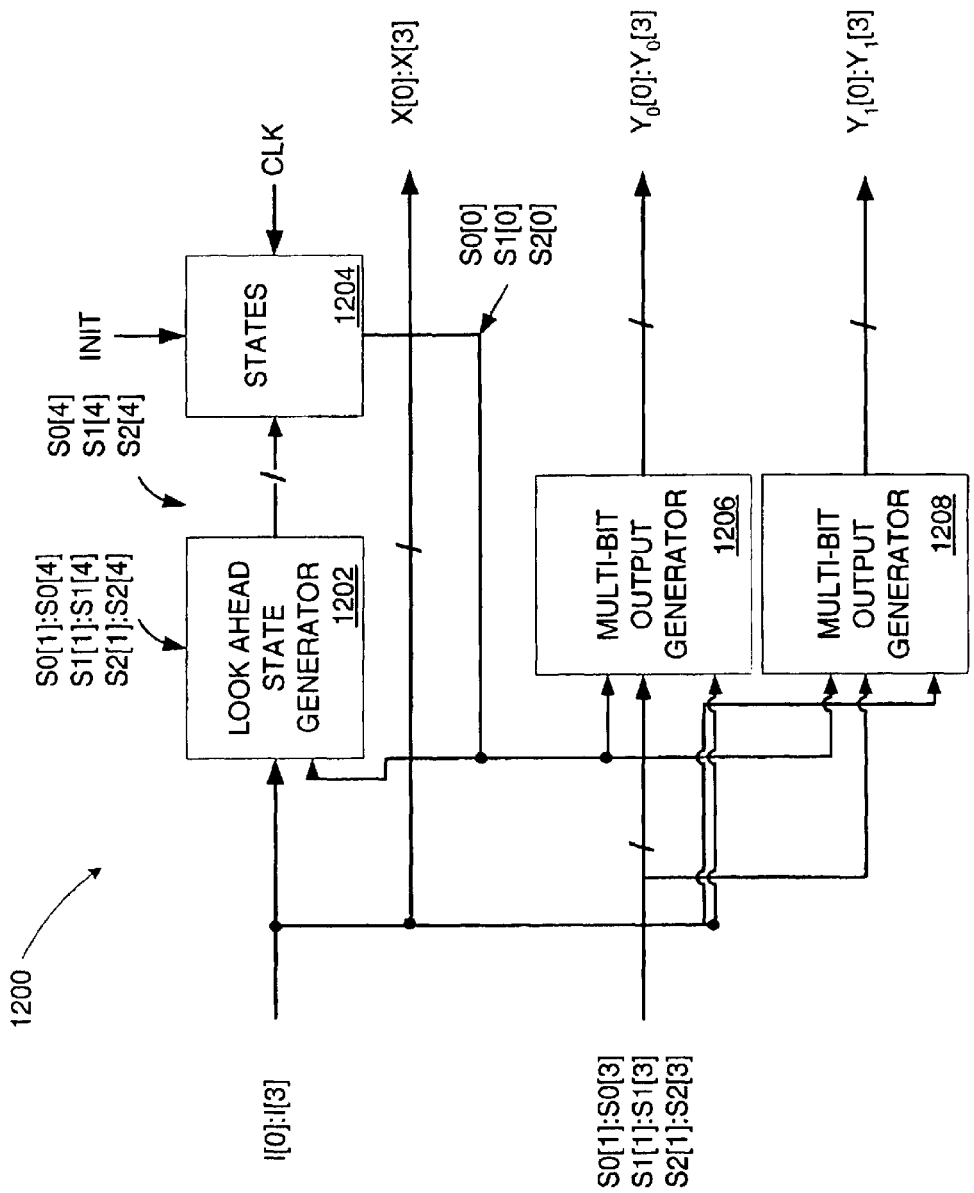
FIG. 14 is a functional diagram of address generation circuitry for an interleaver in a turbo encoder according to one embodiment.

As illustrated in FIG. 14, information bits I[0]:I[3] are presented to an encoder 1200, similar to encoders 1500 and 1100. The encoder 1100 includes a look ahead state generator 1200 for applying Equations (16) and (17) to the input information bits I[0]:I[3]. The look ahead state generator 1202 generates the state information and stores the states S0[4], S1[4], S2[4] in a register or memory storage device 1204. The state information is updated on each system clock cycle. Prior to storing the first values, the memory storage device 1204 is initialized to predetermined state values. The state values S0[0]:S0[3], S1[0]:S1[3], S2[0]:S2[3] are then provided to multi-bit output generators 1206, 1208. The input information bits I[0]:I[3] are provided as the outputs X[0]:X[3]. The multi-bit output generator 1206 generates the outputs $Y_0$[0]:$Y_0$[3]; while the multi-bit output generator 1208 generates the outputs $Y_1$[0]:$Y_1$[3]. The multi-bit output generators 1206 and 1208 recursively calculate values based on Equations (16) and (17) given hereinabove.

As discussed hereinabove, the address generation of the exemplary embodiment provides four read addresses to four turbo interleaver memories 1104, . . . , 1106. The turbo interleaving addresses do not have a discernible pattern, and therefore, it is desirable to generate four copies of each address to obtain a read throughput of 4 bits per clock. Each of the interleaver memories 1104, . . . , 1106 provide one 16 bit word as a read word; one bit is selected from each 16 bit read word via multiple 16:1 multiplexers. In the exemplary embodiment, each interleaver 1104, . . . , 1106 is coupled to a multiplexer 1140, . . . , 1142, respectively. The 4 bits (i.e., one bit from each interleaver 1104, . . . , 1106) are then passed to the second encoder 1144.

The total encode time is the time it takes to read the bits into the memories during the first stage plus the time to encode during the second stage. For example, consider a frame size of 4096 bits, wherein the approximate number of cycles to encode the frame is given as:

$$\frac{4096}{16} + \frac{4096}{4} = 1280. \qquad \text{Eq (19)}$$

Therefore, for a system having a 40 MHz system clock, a 4096 bit frame will take approximately 32 μs to encode, which is within a target 40 μs encode time period.

As described hereinabove, the two stage encoder provides the whole packet residing in an internal memory structure. In such structure the input information is provided to the encoder via a read port capable of processing four bits, i.e., quad read port. An external frame source memory is generally one read port, and therefore an alternate method is used to encode the frame from this memory directly. The exemplary embodiment provides a recursive processing of information multiple information bits per clock cycle in order to provide four encoded bits each clock cycle.

The CRC generator 1134 and parallel encoders 1132 and 1144 operate on data at rates greater than 1 bit per clock cycle. The exemplary embodiment implements an AND-XOR tree structure throughout to allow parallel processing. Alternate embodiments may implement any logical structure that recursively implements the Equations (13), (14), and (15). Each AND-XOR tree is given a unique two dimensional array of bits which determine the taps of the AND-XOR tree. For example, consider the parallel encoders 1132, 1144, wherein each includes an internal 3-bit state with different XOR taps for the parity bit outputs, i.e., $Y_0$, $Y_1$. Each encoder 1132, 1144 encodes 4 bits per clock cycle in the parallel implementation, wherein a ⅓ rate encoder will produce 12 bits of data per clock, i.e., 4 X bits, 4 $Y_0$ bits, 4 $Y_1$ bits. Each output bit is dependent on all 4 input bits as well as the current state. Each encoder includes 3 AND-XOR trees that generate the next two groups of 4 bit output values as well as the next 3 bit state. The X output is directly provided from the input to the encoder, and is not provided through an AND-XOR tree.

In the exemplary embodiment, multiple valid addresses are required per clock cycle. According to the exemplary embodiment, the multiple addresses include four addresses. Four independent circuits are used to generate the four independent read addresses. For encoder 1144, 4 input bits are used per clock cycle. These 4 input bits come from four different interleaver address locations in the 4 frame memories, and therefore 4 address generators provide the 4 addresses.

As an example of the recursive operation performed by encoders 1502 (and also 1552) of FIG. 11, and detailed in the specific operation of FIG. 14, consider the following application. The states generated and stored in elements 1510, 1512 and 1514 are identified as states $S_0$, $S_1$, and $S_2$, respectively. The calculation for each state on a given iteration is determined by the following set of equations.

$$S_0[n+1]=I[n] \oplus S_1[n] \oplus S_2[n] \quad \text{Eq (20)}$$

$$S_1[n+1]=S_0[n] \quad \text{Eq (21)}$$

$$S_2[n+1]=S_1[n] \quad \text{Eq (22)}$$

wherein n is the iteration index. The encoder 1500 has received an input I[0], corresponding to the input at iteration 0. Correspondingly, each of the elements 1510, 1512, and 1514 have been initialized to a values $S_0[0]$, $S_1[0]$, and $S_2[0]$. In this case, for iteration n=1, the equations are implemented as:

$$S_0[1]=I[0] \oplus S_1[0] \oplus S_2[0] \quad \text{Eq (23)}$$

$$S_1[1]=S_0[0] \quad \text{Eq (24)}$$

$$S_2[1]=S_1[0] \quad \text{Eq (25)}$$

wherein the input values and state values for n=0 (at initialization). Similarly, on iteration n=2, the values from iteration n=1 are stored in the elements 1510, 1512, and 1514 and are used to calculate state values as:

$$S_0[2]=I[1] \oplus S_1[1] \oplus S_2[1] \quad \text{Eq (26)}$$

$$S_1[2]=S_0[1] \quad \text{Eq (27)}$$

$$S_2[2]=S_1[1]. \quad \text{Eq (28)}$$

Using the previously generated values and relationships, Equations (26), (27) and (28) result in:

$$S_0[2]=I[1] \oplus S_1[1] \oplus S_2[1] \quad \text{Eq (29)}$$

$$S_0[2]=I[1] \oplus S_0[0] \oplus S_1[0] \quad \text{Eq (30)}$$

$$S_1[2]=S_0[1] \quad \text{Eq (31)}$$

$$S_1[2]=I[0] \oplus S_1[0] \oplus S_2[0] \quad \text{Eq (32)}$$

$$S_2[2]=S_1[1] \quad \text{Eq (33)}$$

$$S_2[2]=S_0[0]. \quad \text{Eq (34)}$$

The results for iteration n=3 are given as:

$$S_0[3]=I[2] \oplus S_1[2] \oplus S_2[2] \quad \text{Eq (35)}$$

$$S_0[3]=I[2] \oplus (I[0] \oplus S_1[0] \oplus S_2[0]) \oplus S_0[0] \quad \text{Eq (36)}$$

$$S_1[3]=S_0[2] \quad \text{Eq (37)}$$

$$S_1[3]=I[1] \oplus S_0[0] \oplus S_1[0] \quad \text{Eq (38)}$$

$$S_2[3]=S_1[2] \quad \text{Eq (39)}$$

$$S_2[3]=I[0] \oplus S_1[0] \oplus S_2[0]. \quad \text{Eq (40)}$$

Similarly, the results for iteration n=4 are given as:

$$S_0[4]=I[3] \oplus S_1[3] \oplus S_2[3] \quad \text{Eq (41)}$$

$$S_0[4]=I[3] \oplus (I[1] \oplus S_0[0] \oplus S_1[0]) \oplus S_2[0]) \text{ Eq (42)}$$

$$S_0[4]=I[0] \oplus (I[1] \oplus I[3] \oplus S_0[0]) \oplus S_2[0] \quad \text{Eq (43)}$$

$$S_1[4]=S_0[3] \quad \text{Eq (44)}$$

$$S_1[4]=I[2] \oplus I[0] \oplus S_1[0] \oplus S_2[0] \oplus S_0[0] \quad \text{Eq (45)}$$

$$S_2[4]=S_1[3] \quad \text{Eq (46)}$$

$$S_2[4]=I[1] \oplus S_0[0] \oplus S_1[0] \quad \text{Eq (47)}$$

Note that some iterations result in similar state calculation relationships that may be exploited in encoder design and operation.

Continuing with operation of the encoder 1100, during the first stage, memories within the encoder are written with the same data at the same memory addresses. During the second stage, the memories are read from independently at different addresses.

Returning to FIG. 12, the circuit of FIG. 12 produces one address per clock cycle. The input counter is a power of two, and therefore, some addresses may be produced that are out of the range defined by the turbo interleaver block size. The invalid addresses are detected and skipped by the address generator. A pipeline register may be inserted half way through the address generation circuit to increase the speed of operation.

Figure 15:
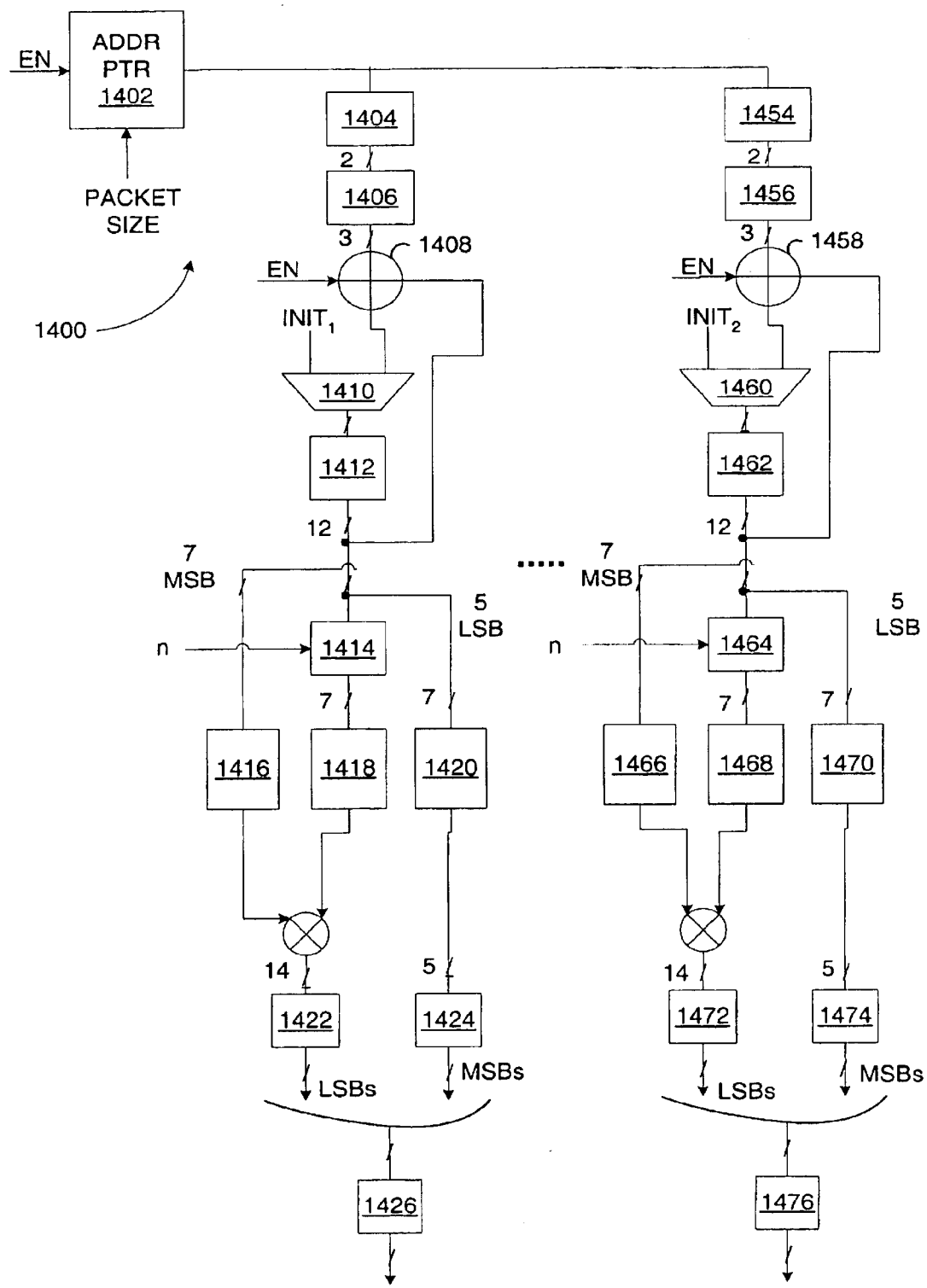
FIG. 15 is a functional diagram of address generation circuitry for an interleaver for parallel concatenated turbo encoders according to one embodiment.

A turbo interleaver address generation circuit 1400 according to one embodiment is illustrated in FIG. 15. An enable signal and a packet size indicator are provided to an address pointer 1402. The output of the address pointer 1402 is provided to parallel circuit paths, and to LUTs 1404, 1454 which are used to increment the address values. The append units 1406, 1456 add 1 bit to the 2 bits received from each of LUTs 1404, 1454, respectively. The outputs of append units 1406, 1456 are provided to adders 1408, 1458, respectively. The result of the add operation is then provided to multiplexers 1410, 1460. An enable signal is provided to each of the multiplexers 1410, 1460, which each produces 12 bits. The output of multiplexers 1410, 1460 are provided to a delay element 1412, 1462, the output of which is fed back to adders 1408, 1458. The outputs of delay elements 1412, 1462 are provided to a network of delay elements including turbo encoder LUTs 1414, 1464. The 7 MSBs of the output of delay elements 1412, 1462 are provided to delay elements 1416, 1466. The 5 LSBs are provided to both the LUTs 1414, 1464 and the delay elements 1420, 1470. The outputs of delay elements 1416 and 1418 are coupled to inputs of a multiplier coupled to delay element 1422. The outputs of delay elements 1466, 1468 are coupled to inputs of a multiplier gate coupled to delay element 1472. The output of delay element 1420 is coupled to a bit reverse unit 1424. The output of delay element 1470 is coupled to a bit reverse unit 1474. Each path is finally provided to a delay element 1426, 1476, respectively.

According to one embodiment, the valid addresses are divided into four groups. Each of counter values resulting in a valid address is determined as well as those counter values that will result in an invalid address. The mapping of counter values to addresses is stored in the LUTs 1404, 1454. For each individual LUT, when the counter value increments to a value corresponding to an invalid address, the LUT outputs an appropriate offset value to provide the next counter value corresponding to a valid address. In this way, the address generator only generates valid addresses. The process avoids unnecessary address calculations, i.e., calculation of invalid addresses that are later discarded.

Figure 16:
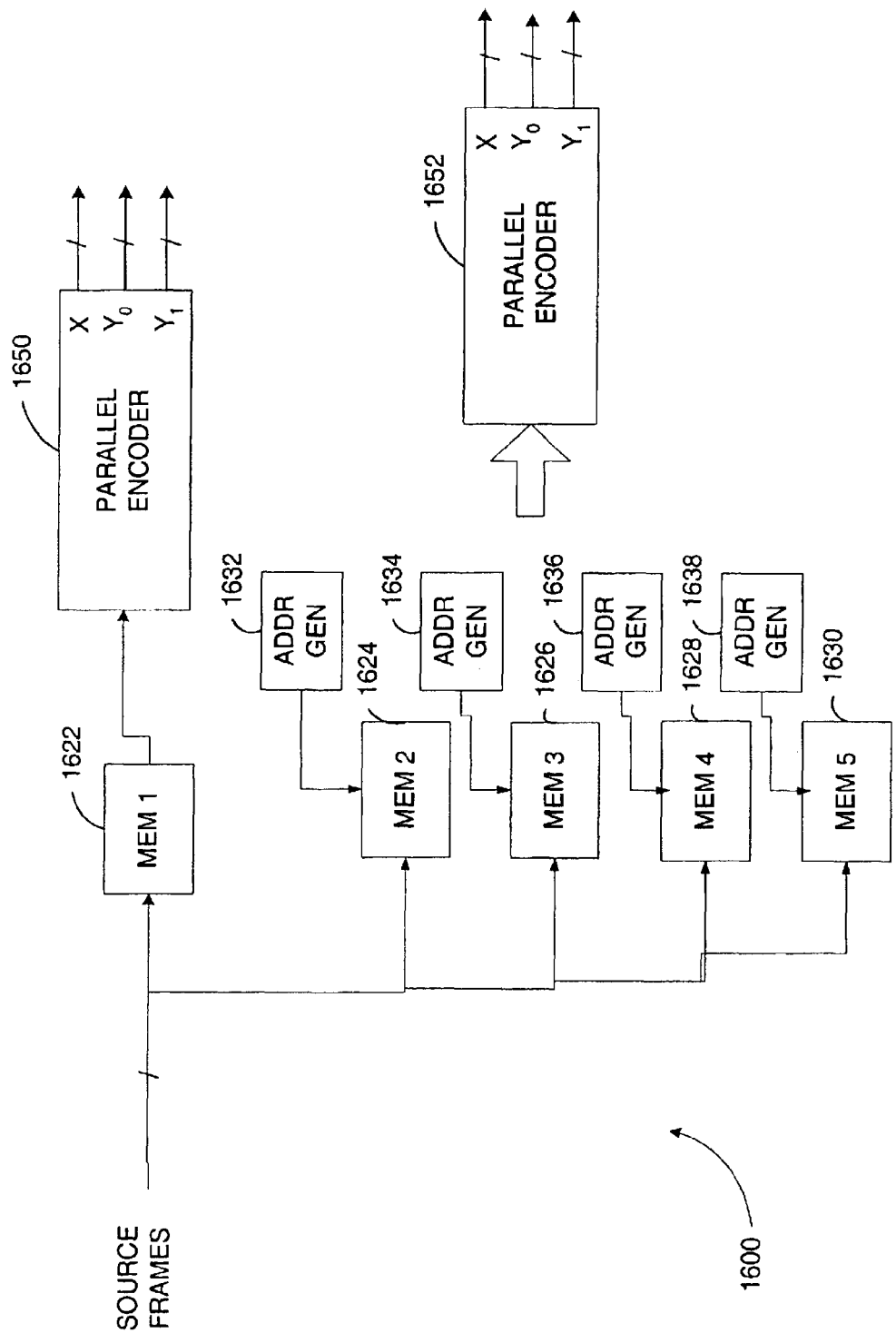
FIG. 16 is a functional diagram of a turbo encoder according to one embodiment.

The address generation circuitry of FIG. 15 may be applied to an encoder configuration such as encoder 1600 of FIG. 16. Encoder 1600 is responsive to an external memory which provides the frame to be encoded. Five copies are made of the input data and stored in each of memories 1622, 1624, 1626, 1628, and 1630, named respectively MEM 1, MEM 2, MEM 3, MEM 4, and MEM 5. MEM 1 provides 4 sequential bits to encoder 1650. The addresses within MEM 1 are accessed sequentially. The encoder 1650 provides 4 bit outputs for each of X, $Y_0$, and $Y_1$.

Address generators 1632, 1634, 1636, and 1638 are coupled to MEM 2, MEM 3, MEM 4, and MEM 5, respectively. The MEM 2, MEM 3, MEM 4, and MEM 5 each provide one bit to parallel encoder 1652. The parallel encoder 1652 also provides 4 bit outputs for each of X, $Y_0$, and $Y_1$.

The address generators 1632, 1634, 1636, and 1638 produce unique series of address locations for each of the associated memories. For example, in one scheme, address generator 1632 produces address locations 0, 4, 8, etc.; address generator 1634 produces address location 1, 5, 9, etc.; address generator 1636 produces address location 2, 6, 10, etc.; address 1638 produces address location 3, 7, 11, etc. When the address generated exceeds the block size of the interleaver, the address generator skips this address.

FIG. 17 illustrates a method 2000 for generating addresses for interleaving as used in a parallel turbo encoder. The method increments a counter at step 2002. The counter value is used to generate an address for interleaving input data in a turbo encoder, such as the embodiment illustrated in FIG. 16. At decision diamond 2004 the counter value is then checked to determine if the counter value will result in an invalid address. The invalid addresses are predetermined, wherein the counter values corresponding to the invalid addresses are stored in a memory storage device. The invalid addresses are addresses larger than the size of the data packet. If the counter value will result in an invalid address, the process continues to step 2006 to adjust the counter to a next valid address. Else processing continues to step 2008 to generate an address based on the counter value, either originally generated or adjusted. If the packet is complete at decision diamond 2010, processing terminates. Else processing returns to step 2002.

The present invention provides a method of encoding multiple bits in parallel, using a recursive method of processing the various outputs. During each clock cycle, the encoder processes multiple bits and generates outputs consistent with those that would be generated sequentially in a conventional convolutional encoder. In one embodiment, input data is stored in multiple memory storage units, which are then each uniquely addressed to provide data to the two parallel encoders, e.g., embodying a turbo encoder.

Thus, a novel and improved method and apparatus for encoding multiple bits in parallel, using a recursive method of processing the various outputs has been presented. Addresses are generated for the interleaving operation by use of multiple memory storage devices, wherein a counter is used for generation of interleaver addresses and a mapping is provided to identify invalid addresses. Those of skill in the art would understand that the data, instructions, commands, information, signals, bits, symbols, and chips that may be referenced throughout the above description are advantageously represented by voltages, currents, electromagnetic waves, magnetic fields or particles, optical fields or particles, or any combination thereof. Those of skill would further appreciate that the various illustrative logical blocks, modules, circuits, and algorithm steps described in connection with the embodiments disclosed herein may be implemented as electronic hardware, computer software, or combinations of both. The various illustrative components, blocks, modules, circuits, and steps have been described generally in terms of their functionality. Whether the functionality is implemented as hardware or software depends upon the particular application and design constraints imposed on the overall system. Skilled artisans recognize the interchangeability of hardware and software under these circumstances, and how best to implement the described functionality for each particular application. As examples, the various illustrative logical blocks, modules, circuits, and algorithm steps described in connection with the embodiments disclosed herein may be implemented or performed with a (DSP), (ASIC), a Field Programmable Gate Array (FPGA) or other programmable logic device, discrete gate or transistor logic, discrete hardware components such as, e.g., registers and First In First Out FIFO, a processor executing a set of firmware instructions, any conventional programmable software module and a processor, or any combination thereof designed to perform the functions described herein. The processor may advantageously be a microprocessor, but in the alternative, the processor may be any conventional processor, controller, microcontroller, programmable logic device, array of logic elements, or state machine. The software module could reside in RAM, flash memory, Read Only Memory (ROM), Erasable Programmable ROM (EPROM), Electrically Erasable Programmable ROM (EEPROM), registers, hard disk, a removable disk, a CD-ROM, or any other form of storage medium known in the art. An exemplary processor is advantageously coupled to the storage medium so as to read information from, and write information to, the storage medium. In the alternative, the storage medium may be integral to the processor. The processor and the storage medium may reside in an ASIC. The ASIC may reside in a telephone or other user terminal. In the alternative, the processor and the storage medium may reside in a telephone or other user terminal. The processor may be implemented as a combination of a DSP and a microprocessor, or as two microprocessors in conjunction with a DSP core, etc.

Preferred embodiments of the present invention have thus been shown and described. It would be apparent to one of ordinary skill in the art, however, that numerous alterations may be made to the embodiments herein disclosed without departing from the spirit or scope of the invention. Therefore, the present invention is not to be limited except in accordance with the following claims.

What is claimed is:

1. An address generation apparatus for an interleaver in a wireless communication system, the apparatus comprising:
   a counter; and
   a plurality of address generators each coupled to the counter, each of the plurality of address generators comprising:
      a memory storage device coupled to the counter, storing a plurality of counter values with corresponding counter offset values; and
      a second counter coupled to the memory storage device, adapted to add the counter offset value to a previously generated address.

2. The apparatus as in claim 1, wherein the second counter comprises:
   an adder having a first input coupled to the memory storage device;
   a multiplexor having a first input coupled to an output of the adder and a second input coupled to a predetermined initialization value; and
   a second memory storage device coupled to the output of the multiplexor and having an output coupled to a second input to the adder.

3. The apparatus as in claim 2, further comprising:
   append circuitry coupled between the memory storage device and the second counter, wherein the append circuitry appends a predetermined value to the output of the memory storage device.

4. The apparatus as in claim 3, wherein the first memory storage device is a look up table.

5. A data encoder, comprising:
   a plurality of memories for storing sequential input information bits;
   a plurality of interleavers for scrambling the input information bits, each of the plurality of interleavers configured to receive input information bits in parallel;
   a first encoder coupled to a first of the memories, the first encoder adapted to encode the sequential input information bits; and
   a second encoder coupled to the plurality of memories, the second encoder adapted to encode the interleaved input information bits.

6. The data encoder as in claim 5, wherein the first encoder and the second encoder process multiple bits per system clock cycle.

7. The data encoder as in claim 6, wherein the first encoder and the second encoder include a plurality of AND-XOR trees.

8. The data encoder as in claim 7, wherein the first encoder and the second encoder recursively process multiple bits.

* * * * *

UNITED STATES PATENT AND TRADEMARK OFFICE
CERTIFICATE OF CORRECTION

PATENT NO. : 6,954,885 B2
APPLICATION NO. : 10/020532
DATED : October 11, 2005
INVENTOR(S) : Hurt et al.

It is certified that error appears in the above-identified patent and that said Letters Patent is hereby corrected as shown below:

Column 19, line 40, please replace "TABLE 8" with --TABLE 7--;

Column 19, line 61, please replace "Table 8" with --Table 7--; and

Column 19, line 64, after "invention" please insert --and--.

Signed and Sealed this

Fifth Day of September, 2006

JON W. DUDAS
*Director of the United States Patent and Trademark Office*